United States Patent
Gavens

(10) Patent No.: US 10,642,746 B2
(45) Date of Patent: May 5, 2020

(54) CONTROLLING CACHED/NON-CACHED MEMORY ACCESS DECISIONS BASED ON MEMORY ACCESS QUEUE FILL LEVELS

(71) Applicant: Western Digital Technologies, Inc., San Jose, CA (US)

(72) Inventor: Lee Merrill Gavens, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 83 days.

(21) Appl. No.: 16/028,200

(22) Filed: Jul. 5, 2018

(65) Prior Publication Data

US 2019/0294553 A1 Sep. 26, 2019

Related U.S. Application Data

(60) Provisional application No. 62/646,791, filed on Mar. 22, 2018.

(51) Int. Cl.
| | | |
|---|---|---|
| *G06F 12/0893* | (2016.01) | |
| *G06F 13/16* | (2006.01) | |
| *G11C 11/56* | (2006.01) | |
| *G11C 16/26* | (2006.01) | |

(52) U.S. Cl.
CPC ...... *G06F 12/0893* (2013.01); *G06F 13/1642* (2013.01); *G11C 11/5628* (2013.01); *G11C 16/26* (2013.01); *G06F 2212/222* (2013.01); *G11C 2211/5643* (2013.01)

(58) Field of Classification Search
CPC ............. G06F 13/1642; G06F 12/0893; G06F 2212/222; G11C 11/5628; G11C 16/26; G11C 2211/5643

USPC .......................................................... 711/113
See application file for complete search history.

(56) References Cited

U.S. PATENT DOCUMENTS

| | | | | |
|---|---|---|---|---|
| 6,401,147 | B1 * | 6/2002 | Sang ..................... | H04L 47/24 710/14 |
| 7,657,699 | B2 | 2/2010 | Murin et al. | |
| 2004/0268049 | A1 * | 12/2004 | Madter ................ | G06F 12/0888 711/133 |
| 2006/0112250 | A1 * | 5/2006 | Walker ................ | G06F 13/1689 711/167 |

(Continued)

*Primary Examiner* — Hashem Farrokh
(74) *Attorney, Agent, or Firm* — Loza & Loza, LLP; Gabriel Fitch

(57) ABSTRACT

The present disclosure, in various embodiments, describes technologies and techniques for use by a data storage controller or similar device for efficiently and intelligently determining whether to use cached or non-cached memory access commands when accessing a non-volatile memory (NVM) device, such as a particular die of a multi-die NAND flash memory. In some examples, the data storage controller assesses the fill status of a particular memory access die queue (e.g., whether the queue is mostly full or mostly empty) and then determines whether to submit memory access commands to a NAND die as cached operations or non-cached operations based on the assessed fill status. In illustrative examples, the determination is made by a die manager based on the number of entries in the queue, with cached commands used if the entries exceed a predetermined threshold, and non-cached commands used otherwise. Method, system and apparatus examples are provided herein.

29 Claims, 20 Drawing Sheets

(56) References Cited

U.S. PATENT DOCUMENTS

| | | |
|---|---|---|
| 2011/0149650 A1 | 6/2011 | Huang et al. |
| 2013/0121072 A1 | 5/2013 | Li |
| 2016/0077759 A1* | 3/2016 | Hsiao .................... G06F 3/0625 711/165 |
| 2016/0202914 A1* | 7/2016 | Hsu ....................... G06F 3/0604 714/49 |
| 2017/0123664 A1 | 5/2017 | Parker et al. |
| 2018/0232178 A1* | 8/2018 | Iwaki .................... G06F 3/0659 |

\* cited by examiner

1700

*Further Exemplary operations for use by a Data Storage Controller for a Multi-Die System with Single Stage Queues*

Assess the fill status of each of a set of single-stage memory access queues (e.g. a read request queues) associated with a set of dies of an NVM device (such as NAND dies) by using a die manager to separately count (or otherwise determine or input) the number of entries in each separate single-stage memory access queue for each respective die. — 1702

Separately determine, on a queue-by-queue basis, whether to submit memory access operations to a particular NVM die as cached operations or as non-cached operations based on (a) the number of entries in the memory access queue for the particular die by using the die manager to compare the number of entries in the single-stage queue for a particular die to a single-stage queue threshold (T) used for all dies and/or (b) whether the particular die is in a true ready state. — 1704

Access the particular die by: — 1706 submitting the memory access operations to the particular die as cached operations (a) if the number of entries in the single-stage queue for that die exceeds the single-stage queue threshold (T) and/or (b) so long as that die has not yet reached a true ready state; and submitting the memory access operations to the particular die as non-cached operations (a) if the number of entries in the single-stage queue for the die does not exceed the single-stage queue threshold and/or (b) if cached operations were previously enabled, resuming non-cached operations if the corresponding queue becomes empty and/or the corresponding die has reached the true ready state.

FIG. 17

Further Exemplary operations for use by a Data Storage Controller for a Multi-Die System with Two-Stage Queues

Assess the fill status of each of a set of two-stage memory access queues (e.g. a read request queues) associated with a set of dies of an NVM device (such as NAND dies) -- where each two-stage queue includes a first (inner) and a second (outer) queue, the second (outer) queue receiving entries only if the first (inner) queue is full -- by using a die manager that only has visibility to the second (outer) queue to separately count (or otherwise determine or input) the number of entries in each second (upper) queue for each respective die.  — 1802

Separately determine, on a queue-by-queue basis, whether to submit memory access operations to a particular NVM die as cached operations or as non-cached operations based on the number of entries in the second (outer) queue for the particular die by using the die manager to compare the number of entries in the second (outer) queue for a particular die to a second-stage queue threshold ($T_{OUTER}$) used for all dies (or by using other decision criteria such as true ready status). — 1804

Accessing the particular die by: — 1806 submitting the memory access operations to the particular die as cached operations if the number of entries in the second (outer) queue for that die exceeds the second-stage queue threshold ($T_{OUTER}$); and submitting the memory access operations to the particular die as non-cached operations if the number of entries in the second (outer) queue for the die does not exceed the second-stage queue threshold ($T_{OUTER}$) (or waiting until the entire queue is empty and/or a true ready state is reached to resume non-cached operations if cached operations were previously enabled).

FIG. 18

CONTROLLING CACHED/NON-CACHED MEMORY ACCESS DECISIONS BASED ON MEMORY ACCESS QUEUE FILL LEVELS

CLAIM OF PRIORITY UNDER 35 U.S.C. § 119

The present Application for Patent claims priority to Provisional Application No. 62/646,791 entitled "CONTROLLING CACHED/NON-CACHED MEMORY ACCESS DECISIONS BASED ON MEMORY ACCESS QUEUE FILL LEVELS" filed Mar. 22, 2018, which is assigned to the assignee hereof and hereby expressly incorporated by reference herein.

FIELD

The subject matter described herein relates to data storage devices and controllers. More specifically, the disclosure relates, in some examples, to systems and methods for use by a data storage controller to determine whether to use cached or non-cached memory access operations when accessing non-volatile memories (NVMs) such as flash NAND memories.

INTRODUCTION

Solid state data storage devices incorporating non-volatile memories (NVMs), such as flash NAND storage devices (herein "NANDs"), are replacing or supplementing conventional rotating hard disk drives for mass storage in many consumer electronic devices and computers. In NAND-based products, a data storage controller responds to commands received from a host device by reading or writing data to or from a set of NAND memory dies. One or more memory access queues may be provided for use by a die manager of the host controller for relaying host commands, such as read requests, to individual memory dies.

In high performance NAND systems, when servicing read requests from the host, the die manager decides whether to use cached or non-cached read commands to service the requests. Problems can arise if cached read commands are employed in circumstances where it would be more efficient to use non-cached read commands Conversely, problems can also arise if non-cached read commands are employed in circumstances where it would be more efficient to use cached read commands. For example, data processing bottlenecks can arise, either within the die manager or within a data path coupled to the dies, if the correct choice is not made whether to use cached or non-cached read requests. It would be advantageous to provide systems and methods for use by a die manager (or other suitable device) to efficiently and intelligently determine whether to use cached or non-cached read commands.

SUMMARY

One embodiment of the present disclosure provides a method for use by a data storage controller, the method including: assessing a fill status of a memory access queue associated with a memory device; determining a memory access procedure for use in accessing the memory device based on the fill status of the memory access queue; and accessing the memory device based on the determined memory access procedure.

Another embodiment of the present disclosure provides a data storage controller, where the data storage controller includes: a queue assessment component configured to determine a fill level of a memory access queue associated with the memory device; a memory access determination component configured to determine a memory access procedure for use in accessing the memory device based on the fill level of the memory access queue; and a memory access controller configured to control access to the memory device based on the determined memory access procedure Yet another embodiment of the present disclosure provides a data storage device that includes: a non-volatile memory (NVM) device having a die; and a die manager configured to determine a fill level of a memory access queue associated with the die, and submit memory access operations to the die as cached operations or as non-cached operations based on the fill level of the memory access queue.

Still yet another embodiment of the present disclosure provides an apparatus for use with a data storage controller, comprising: means for determining a number of entries in a memory access queue associated with a memory device; means for determining a memory access procedure for use in accessing the memory device based on the number of entries in the memory access queue; and means for accessing the memory device based on the determined memory access procedure.

BRIEF DESCRIPTION OF THE DRAWINGS

The subject matter described herein will now be explained with reference to the accompanying drawings of which:

FIG. 17 is a flow chart summarizing further selected operations of the data storage controller, particularly for use with a multi-die system with single-stage queues.

FIG. 18 is a flow chart summarizing alternative selected operations of the data storage controller, particularly for use with a multi-die system with two-stage queues.

DETAILED DESCRIPTION

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Overview

Aspects of the present disclosure provide various apparatus, devices, systems and methods for efficiently and intelligently determining, for example, whether to use cached or non-cached memory access commands when accessing a non-volatile memory (NVM) storage device such as a particular die of a multi-die NAND flash memory. In various examples described herein, the determination is made by assessing the fill level or fill status of a memory access queue, where the terms "fill level" or "fill status" may refer to how many entries are currently stored in the queue, and hence whether the queue is mostly full or mostly empty.

Figure 1:
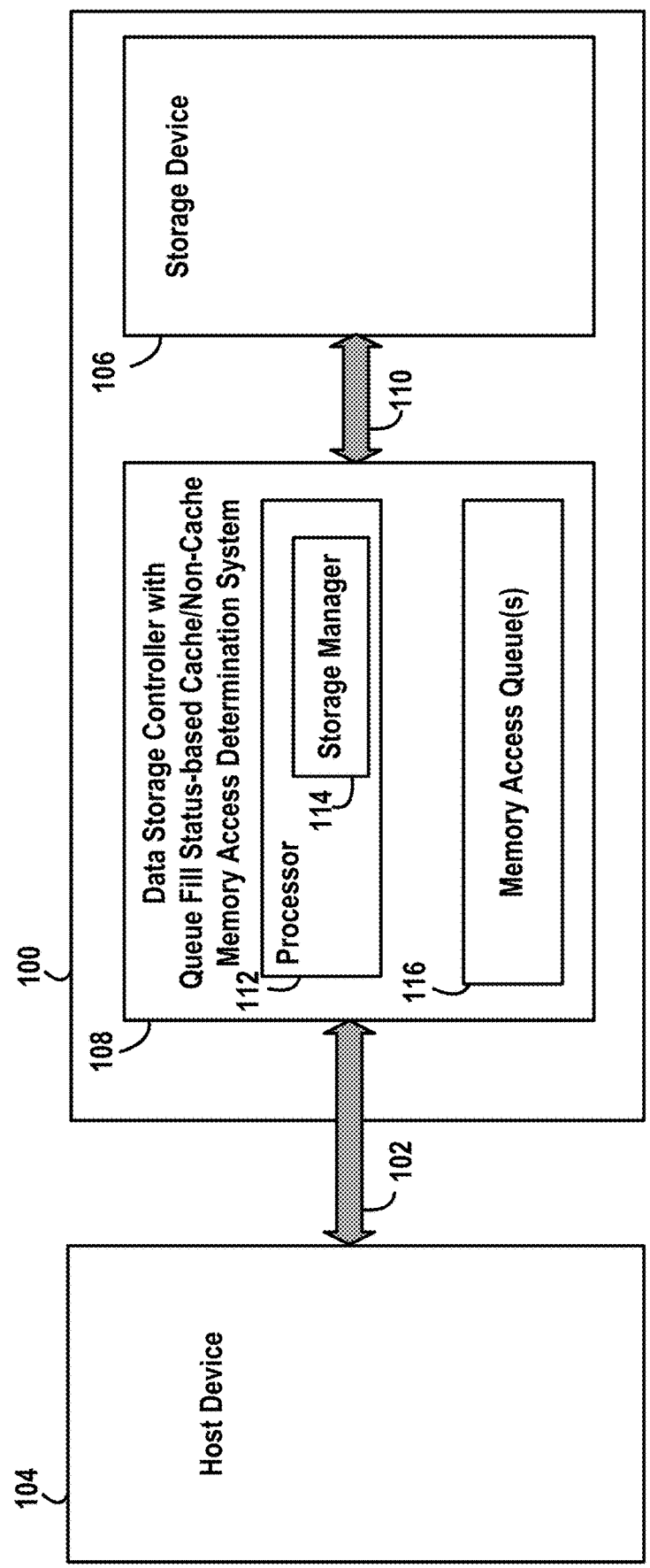
FIG. 1 illustrates a data storage system having a data storage controller and a data storage device (such as a NAND), where the data storage controller is equipped to decide between cached or non-cached memory access operations based on a queue fill status.

FIG. 1 illustrates, at a high level, a data storage system 100 configured to determine, for example, whether to access a storage device using cached or non-cached memory access commands. The data storage system 100 receives read requests (or other memory access commands) along a bus 102 from a host device 104, which may be a video camera or the like. The read requests are used to access a data storage device 106 (which may be, for example, a flash storage device having a set of NAND dies). The data storage system 100 includes a data storage controller 108 equipped with a queue fill status-based cache/non-cache memory access determination system, which determines whether the read requests from the host device 104 are to be relayed to the storage device 106 as cached or non-cached commands or operations (via a bus 110) based on the fill status of one or more memory access queues. In the example of FIG. 1, the data storage controller 108 includes a processor 112 equipped with a storage manager 114 (which may be, for example, a die manager) and one or more memory access queues 116. The storage manager 114 loads the read requests into the memory access queue 116 for processing by the storage device 106, which returns the requested data via the bus 110.

As noted above in the Background Section, problems can arise in data storage systems if cached reads are employed in circumstances where it would be more efficient to use non-cached reads. Conversely, problems can also arise if non-cached reads are employed in circumstances where it would be more efficient to use cached reads. In particular, data processing bottlenecks can arise or occur upstream from the memory access queue(s) 116 of FIG. 1 if cached reads are employed when non-cached reads would be more efficient, and data processing bottlenecks can occur downstream from the memory access queue(s) 116 if non-cached reads are employed when cached reads would be more efficient.

For read commands in a system having multiple NAND dies, the determination of whether read performance would be better optimized by performing cached vs. non-cached reads can be influenced by many factors. Some of the factors are:

1. The number of dies sharing the NAND bus (such as bus 110 of FIG. 1);
2. The length of read requests, i.e. the byte size of each individual request;
3. The rate of incoming read requests from the host;
4. NAND timing specifications, such as the relative time required for cached vs. non-cached sense operations, cache latch transfer speeds, or whether single-level cells (SLC), multiple-level cells (MLC) or triple-level cells (TLC) are used;
5. Read command likelihood, i.e. whether a current mix of read vs. non-read requests from the host suggest more reads are likely;
6. NAND bus throughput (e.g. the throughput of bus 110 of FIG. 1);
7. Host bus throughput (e.g. the throughput of bus 102 of FIG. 1); and
8. Data error and correction factors, such as the data error rate and the low-density parity-check (LDPC) throughput, of data obtained from the NAND die.

Many of these factors are dynamic and may depend on the usage pattern at a particular moment in time. Some data storage controllers attempt to assess these many factors in real-time, which can add considerable overhead to the system and lead to suboptimal decisions. In contrast, the storage manager 114 of FIG. 1 is instead configured to assess a fill status of the memory access queue 116 (such as whether the queue is mostly full or mostly empty) and to then determine whether to submit memory access commands to the storage device 106 as cached operations or instead as non-cached operations based on the fill status.

Herein, "assessing" includes determining, evaluating, calculating, estimating and/or performing similar or synonymous functions or operations that are implementable by a processor, computing machine, state machine, etc., via hardware, software and/or firmware. In many examples described herein, assessing the fill status of a queue is conveniently performed by counting the number of entries in the queue (or by receiving a value indicative of the number of entries from some other component). However, in other examples, assessing the fill status may involve estimating the number of entries in the queue (if an exact count cannot be obtained) and may further involve estimating how quickly the queue is filling up or how quickly the queue is being emptied. Still further, in some examples, assessing the fill status of a queue involves counting the number of entries in a "visible" portion of a two-stage queue where, as will be explained, an outer (visible) portion of the overall queue only begins to fill if an inner (and not directly visible or accessible) portion of the overall queue has become full.

In various illustrative examples, the assessment is made based on a count of the current number of entries in the queue 116, with cached commands used if the number of entries exceeds a predetermined threshold, and non-cached commands used otherwise. In some particular examples, discussed below, once cache usage is activated, the cache usage continues until the queue is empty, at which time non-cache usage resumes automatically. In any case, by assessing the fill status of the memory access queue or queues 116, an efficient and intelligent determination can be made as to whether to submit commands to the storage device 106 as cached operations or instead as non-cached operations.

In the following sections, NAND-based examples are described for systems that have multiple dies. In a first example, there is a single request queue associated with each die, which is referred to herein as a "single-stage" queue to distinguish the queue from queues that instead include two sequential or consecutive queues. In a second example, there is a "two-stage" queue associated with each die, where a second (outer) stage of the queue only begins to fill after a first (inner) stage of the queue is completely full. That is, each two-stage queue includes a pair of sequential or consecutive queues. The terms "single-stage" and "two-stage" are provided herein to allow the different types of queues to be easily distinguished, but the terms are non-limiting and other terms or names can be given to these queues. Both examples employ a die manager to control access to the multiple NAND dies. In these examples, a single die manager is shown, which manages all NAND dies. In other implementations, multiple die managers may be employed. Still further, in the following examples, the queues are shown as separate components from the die manager. In other implementations, the single-stage queue (or the outer queue of the two-stage queue) may be components of the die manager.

Exemplary Multiple-Die NAND System with Single-Stage Queues

Figure 2:
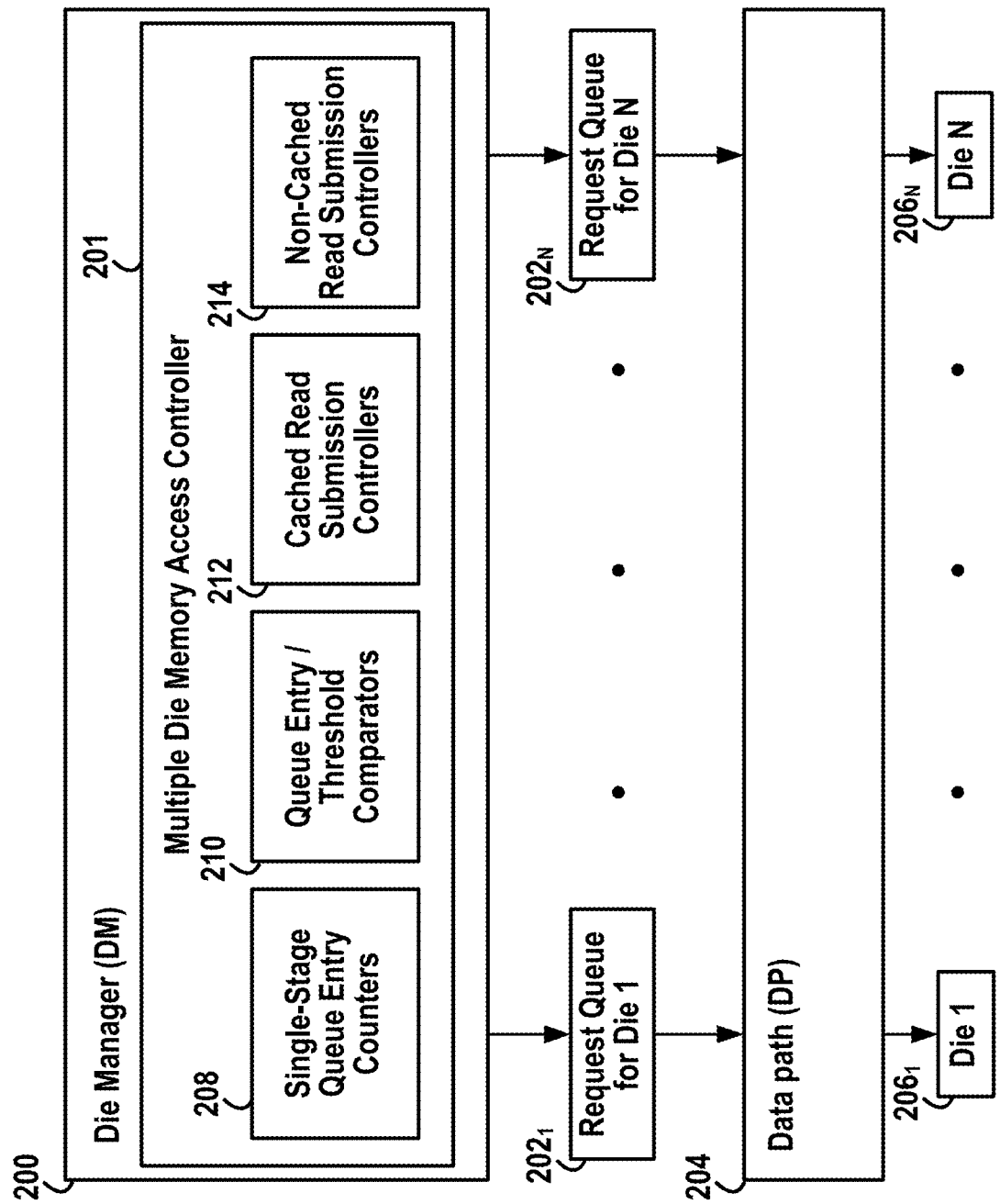
FIG. 2 illustrates selected portions of a multi-die data storage system having a die manager and a data path, where the die manager includes components for assessing queue fill status and for deciding between cached or non-cached memory accesses on a die-by-die basis.

FIG. 2 illustrates an exemplary NAND system where multiple dies are used along with multiple single-stage queues. A die manager 200 includes a multiple die memory access controller 201 with a single-stage queue-based cache/non-cache memory access determination system. The die manager 200 is coupled to a set of single-stage request queues $202_{1-N}$, which are in turn coupled via a data path (DP) 204, to corresponding dies $206_{1-N}$. As shown, in this example, there is one request queue $202_{1-N}$ for each die 204. In the example of FIG. 2, the memory access controller 201 of the die manager 200 is configured to separately assess the fill status of each request queue $202_{1-N}$ using one or more single-stage queue entry counters 208, which can be configured to separately count and track the number of values or entries in each of the queues $202_{1-N}$. The memory access controller 201 determines (on a die by die basis) whether to submit memory access commands to a respective die $206_{1-N}$ as cached operations or as non-cached operations based on the fill status of the corresponding queue $202_{1-N}$.

As noted, the determination may be made based on the number of entries in the corresponding queues $202_{1-N}$, with cached commands used for a particular die if the number of entries in the corresponding queue exceeds the predetermined queue threshold value (T), and non-cached commands used for a particular die otherwise (e.g. if the number of entries for the corresponding queue is less than or equal to T). One or more queue entry/threshold comparators 210 may be used to compare the queue entry count for a particular queue against the queue threshold value (T). One or more cached read submission controllers 212 may be used to submit reads to particular dies as cached reads (if the queue entry count of the queue for the particular die exceeds the queue threshold value (T)). One or more non-cached read submission controllers 214 may be used to submit reads to particular dies as non-cached reads (if the queue entry count of the queue for the particular die does not exceed the queue threshold value (T)).

The particular manner with which reads are processed as cached reads or non-cached reads may depend on the particular system. However, in many examples, specific dedicated cache circuitry is provided to implement cache reads and, in those examples, the cache circuitry is activated to perform cached reads but remains inactive for non-cached reads. If cache reads are activated but the corresponding queue becomes empty, the cache read circuitry is automatically deactivated. In such examples, the die manager need not explicitly switch from cached reads to non-cached reads when a queue falls below its threshold. Rather, the die manager may continue to use cache reads until the queue is empty, at which time the cache circuitry is automatically switched off and non-cached reads resume. In other examples, the die manager instead may be configured to detect the queue falling below a threshold, at which time the die manager explicitly deactivates cached reads and resumes non-cached reads. In such examples, it may be appropriate to use separate upper and lower thresholds to avoid hysteresis issues. That is, the die manger switches from non-cached reads to cached reads if the queue exceeds an upper threshold, but the die manager does not switch back to non-cached reads until the queue falls below a lower threshold. Note also that the particular set of die manager components illustrated in FIG. 2 is merely exemplary. Depending upon the implementation, the components may be implemented as hardware, firmware, software or some combination thereof. Some of the components may be separate from the die manager.

By assessing the fill status of each respective memory access queue $202_{1-N}$, the determination of whether to use cached or non-cached reads can be made intelligently and efficiently on a die-by-die basis. In some examples, for ease of implementation, the same threshold value (T) is used for each of the request queues $202_{1-N}$. Although the same threshold may be used for each queue, it is noted that the current number of entries in each particular queue at any point in time may differ, and so the memory die access controller 201 of the die manager 200 may reach different cache usage determinations for the different dies $206_{1-N}$. That is, at any given time, the die manager 200 may employ cached reads for some of the dies and may instead employ non-cached queues for other dies. In other implementations, each separate queue $202_{1-N}$ might have a separate threshold value associated therewith.

In some illustrative examples, the queue threshold (T) is set in the range of five to eight, particularly if the queue is configured to hold only about ten to fifteen total values. And so, in some particular examples, the queue threshold (T) is set to five and, in other particular examples, the queue threshold (T) is set to six. In still other examples, particularly if the queue is configured to hold a much larger number of entries, the queue threshold (T) may be set to a much higher value. In some implementations, it may be desirable to determine an optimal value for the threshold (T) by, for example, conducting experiments on test systems to determine a value for the threshold (T) that optimizes overall read efficiency. However, in other examples, for simplicity and ease of design and implementation, the value for (T) is just set to a fixed value (such as five) during the design phase of the system.

Figure 3:
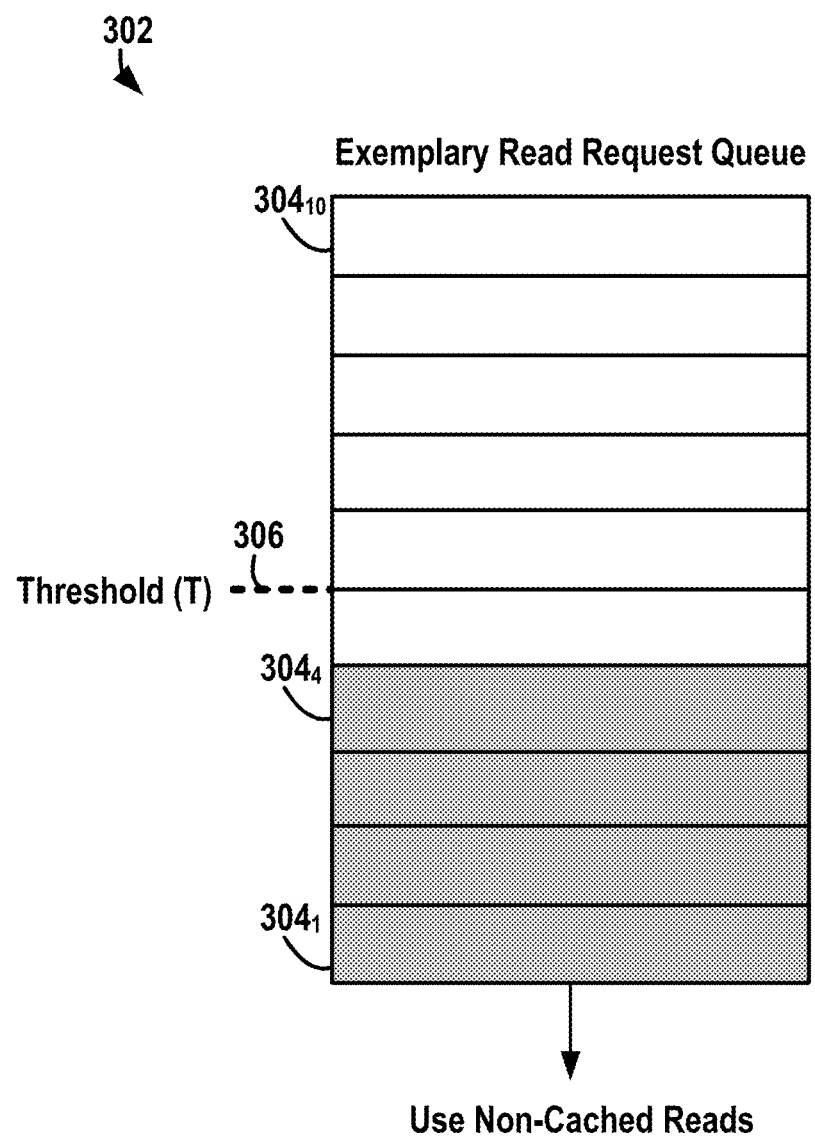
FIG. 3 illustrates an exemplary single-stage read request queue for an individual die along with a threshold used to assess queue fill status, for an example where the queue is mostly empty.

FIG. 3 illustrates an exemplary read request queue 302 that is sized or configured to store up to ten entries $304_1$-$304_{10}$. In the example of FIG. 3, a threshold (T) 306 is set to five entries. That is, if the die manager determines that the read request queue 302 holds five or fewer entries, the die manager uses non-cached read request commands when accessing the die (with which the queue 302 is associated). On the other hand, if the die manager determines that the read request queue 302 holds more than five entries, the die manager uses cached read request commands when accessing the die. In the particular example of FIG. 3, there are only four entries in the read request queue 302 (as shown via the shaded queue entry blocks), and so the die manager uses non-cached read request commands when accessing the die.

Figure 4:
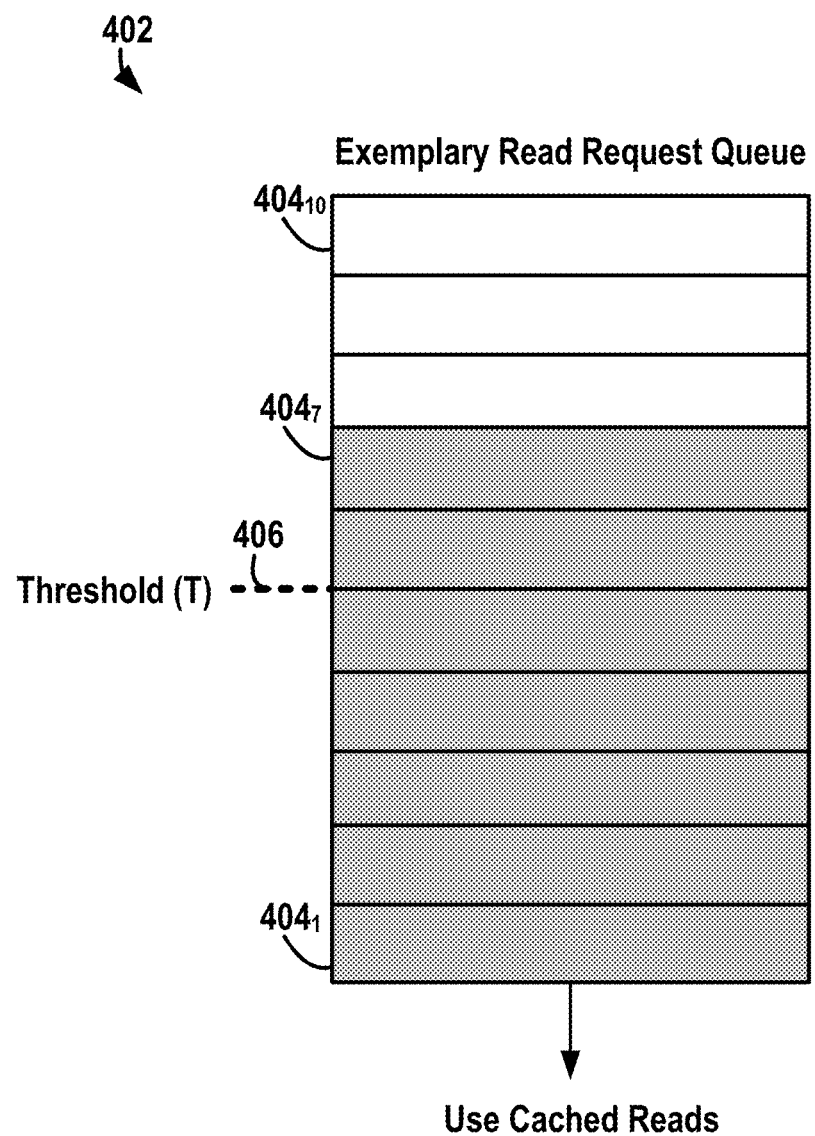
FIG. 4 illustrates another exemplary single-stage read request queue for an individual die and the assessment threshold, for an example where the queue is mostly full.

FIG. 4 illustrates another exemplary read request queue 402 also sized to store up to ten entries $404_1$-$404_{10}$. In the example of FIG. 4, the threshold (T) 406 is again set to five entries. In the particular example of FIG. 4, there are seven entries in the read request queue 402 (as shown via the shaded entry blocks), and so the die manager uses cached read request commands when accessing the corresponding die.

Figure 5:
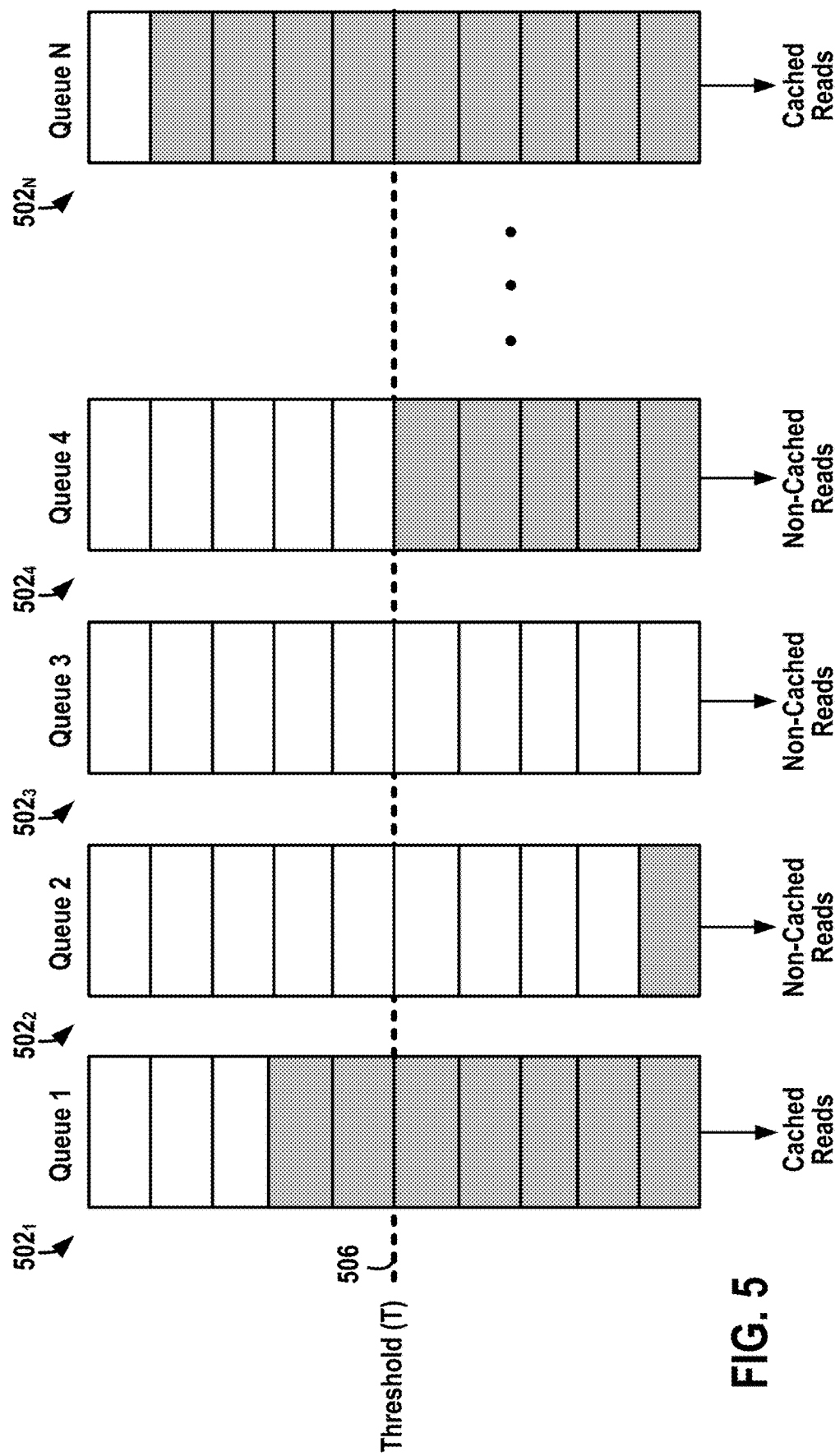
FIG. 5 illustrates the use of a single threshold for a set of separate read request queues, where some of the queues are mostly full and others are mostly empty.

FIG. 5 illustrates the use of a single threshold (T) 506 for a set of N read request queues $502_{1-N}$ each sized to store up to ten entries. In the example of FIG. 5, the threshold (T) 506 is again set to five entries. For the case of Queue 1 $502_1$, there are seven entries and so, for that particular queue (Queue 1 $502_1$) and its corresponding die, cached reads are employed by the die manager to read data from the corresponding die. For the case of Queue 2 $502_2$, there is only one entry and so, for that particular queue and its corresponding die, non-cached reads are employed by the die manager to read data from the corresponding die. For the case of Queue 3 $502_3$, there are no entries and so, for that particular queue and its corresponding die, non-cached reads are also employed by the die manager to read data from the corresponding die. For the case of Queue 2 $502_4$, there are five entries and so, for that particular queue and its corresponding die, non-cached reads are likewise employed by the die manager to read data from the corresponding die. For the case of Queue N $502_N$, there are nine entries and so, for that particular queue (Queue N $502_N$) and its corresponding die, cached reads are employed by the die manager to read data from the particular die.

Figure 6:
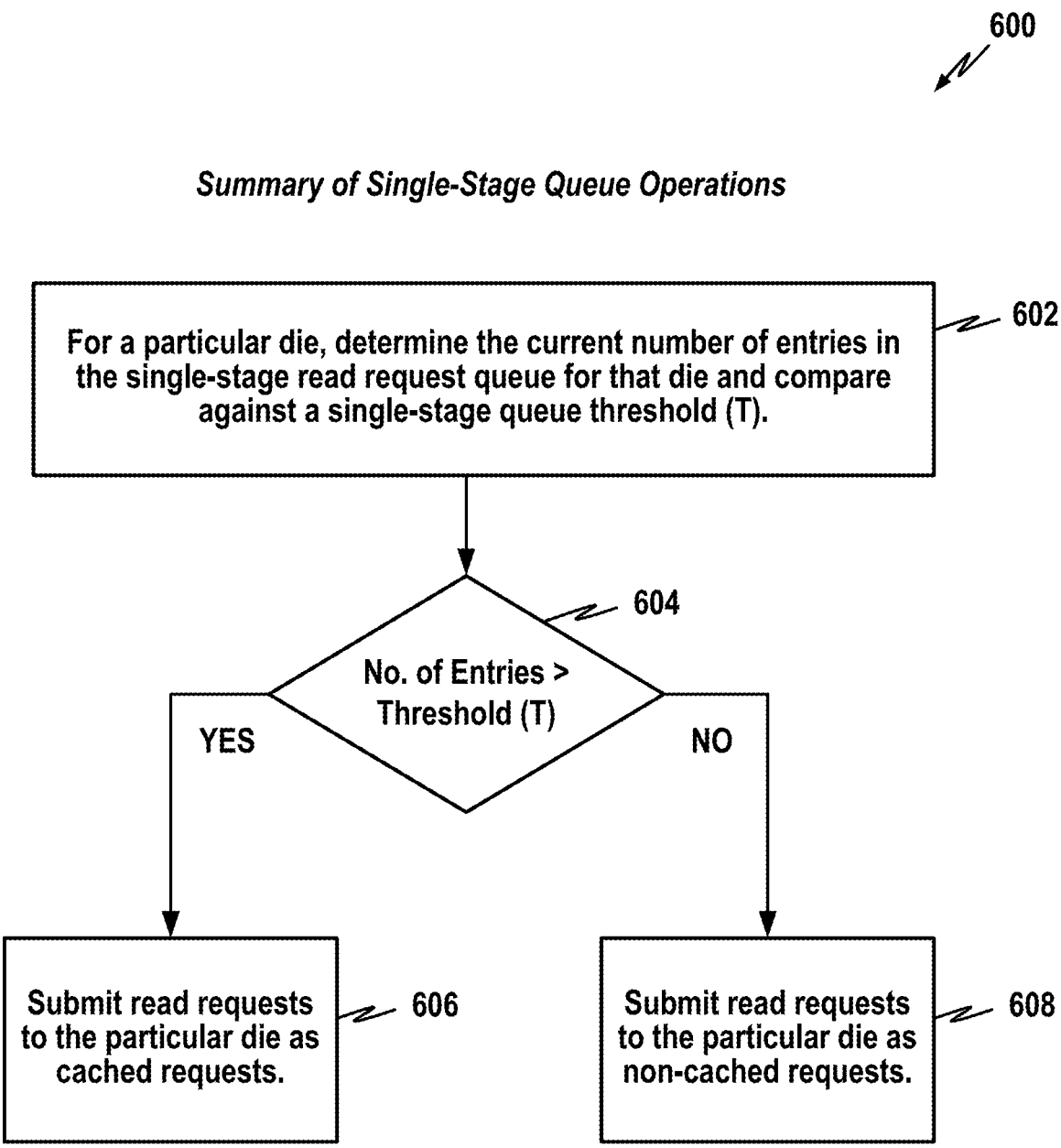
FIG. 6 is a flowchart summarizing the single-stage queue operations of FIGS. 2-5.

FIG. 6 is a flowchart that broadly summarizes the single-stage queue operations or procedures 600 of FIGS. 2-5. Briefly, at 602, the die manager (or other suitable component of the data storage controller) determines, for a particular die, the current number of entries in the single-stage read request queue for that die and compares against a single-stage queue threshold (T). If, at the decision block 604, the number of entries is found to exceed the threshold (T), then, at block 606, the die manager submits read requests to the particular die as cached requests. Otherwise, at block 608, the die manager submits the read requests to the particular die as non-cached requests. As already explained, this logic may be applied to each die of a multi-die system where the die has its own queue associated with the die. Examples are described below where cached reads continue until the queue is empty (at which time non-cached reads automatically resume). Other examples are described where upper and lower thresholds are used to switch between cached and non-cached reads to avoid hysteresis issues.

Exemplary Multiple-Die NAND System with Two-Stage Queues

Figure 7:
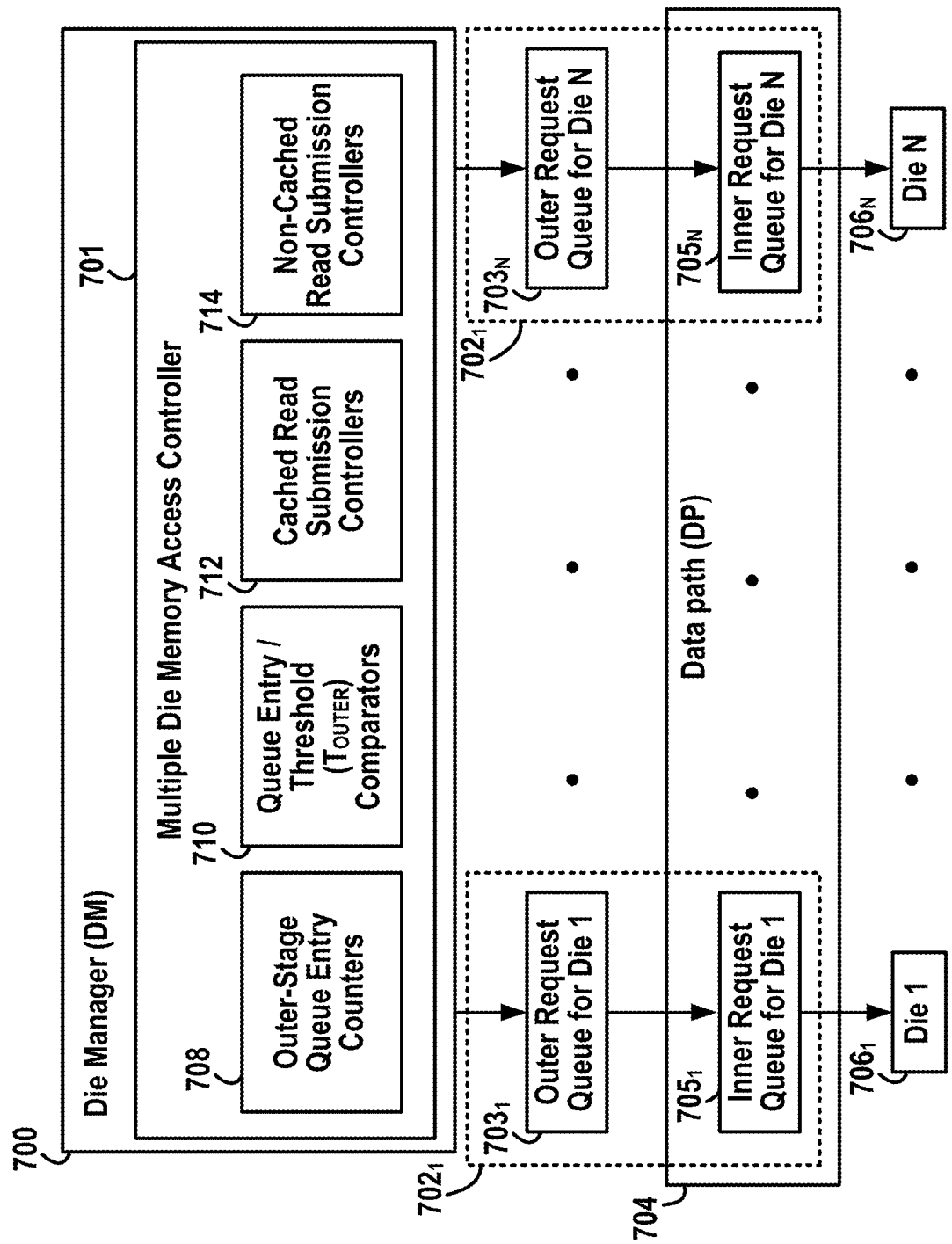
FIG. 7 illustrates selected portions of a multi-die data storage system having a die manager and a data path, where each queue is a two-stage queue having inner and outer queues.

FIG. 7 illustrates another multi-die NAND system (similar to FIG. 2) where multiple dies are used along with multiple queues. However, whereas FIG. 2 illustrates a single queue associated with each die, the system of FIG. 7 employs a two-stage queue arrangement where each die is associated with a pair of coupled queues. An outer queue (which may also be referred to as second, secondary, upstream or visible queue) stores entries only if an inner queue (which may also be referred to as a first, primary, downstream or invisible queue) becomes full. In this example, the die manager only has visibility to the outer queues, i.e. the die manager cannot directly count the number of entries in the inner queues, and so, as will be explained, the determination threshold is applied to the number of entries in the outer queues.

More specifically, in FIG. 7, a die manager 700 includes a multiple die memory access controller 701 with a two-stage queue-based cache/non-cache memory access determination system. The die manager 700 is coupled to a set of two-stage request queues $702_{1-N}$ via a data path 704 to corresponding dies $706_{1-N}$. As shown, in this example, each request queue $702_{1-N}$ includes an outer request queue $703_{1-N}$ and an inner request queue $705_{1-N}$, where the inner request queue $705_{1-N}$ is a component of the data path 704. Memory request commands (e.g. read requests) for a particular die $706_{1-N}$ are initially pushed into the corresponding inner request queue $705_{1-N}$ for that particular die (by, e.g., the data path 704 based on signals received from the die manager 700). The corresponding outer request queue $703_{1-N}$ for that die only begins to fill if the respective inner request queue $705_{1-N}$ has become full. That is, the outer request queues $703_{1-N}$ may be described as "overflow" queues.

The die manager 700, in this example, is not capable of directly counting the number of entries in the inner request queues $705_{1-N}$, i.e. the die manager 700 does not have visibility to the inner queues. Accordingly, in this example, the memory access controller 701 of the die manager 700 is configured to assess the fill status of each outer request queue $703_{1-N}$ and to then determine (on a die by die basis) whether to submit memory access commands to a respective die $706_{1-N}$ as cached operations or instead as non-cached operations based on the assessed fill status of the corresponding outer queue $703_{1-N}$. The determination may be made based on the number of entries in the corresponding outer queue $703_{1-N}$, with cached commands used if the number of entries in the corresponding outer queue exceeds a predetermined outer queue threshold ($T_{OUTER}$), and non-cached commands used otherwise (e.g. if the number of entries in the outer queue is less than or equal to $T_{OUTER}$).

In the example of FIG. 7, the memory access controller 701 is configured to separately assess the fill status of each outer queue $703_{1-N}$ using one or more outer-stage queue entry counters 708, which can be configured to separately count and track the number of values or entries in each of the outer queues $703_{1-N}$. One or more outer-stage queue entry/ threshold ($T_{OUTER}$) comparators 710 may be used to compare the count for a particular outer queue against the queue threshold value ($T_{OUTER}$). One or more cached read submission controllers 712 may be used to submit reads to particular dies as cached reads (if the queue entry count of the outer queue for the particular die exceeds the queue threshold value ($T_{OUTER}$)). One or more non-cached read submission controllers 714 may be used to submit reads to particular dies as non-cached reads (if the queue entry count of the outer queue for the particular die does not exceed the queue threshold value ($T_{OUTER}$)). The particular set of die manager components is again merely exemplary. Depending upon the implementation, the components may be implemented as hardware, firmware, software or some combination thereof. Some of the components may be separate from the die manager.

By assessing the fill status of each respective memory access outer queue $703_{1-N}$, an efficient and intelligent determination again can be made on a die-by-die basis as to whether cached or non-cached reads should be used for each particular die. In some examples, for ease of implementation, the same outer threshold value ($T_{OUTER}$) is used for each of the outer request queues $703_{1-N}$. Although the same threshold may be used for each queue, it is again noted that the current number of entries in each particular queue at any point in time may be different, and so the die manager 700 may reach different cache determinations for the different dies $706_{1-N}$. That is, as with the system of FIG. 2, the die manager 700 may employ cached reads for some dies and may instead employ non-cached reads for other dies. In other implementations, each separate outer queue $703_{1-N}$ might have a separate threshold value associated therewith.

Notably, the outer queue threshold ($T_{OUTER}$) of the system of FIG. 7 may be set to a different value than the threshold (T) used with the single-stage queue system of FIGS. 2-5. In practice, the outer queue threshold ($T_{OUTER}$) of the system of FIG. 7 is set to a lower value than T to account for the fact that an outer queue of FIG. 7 does not begin to fill until the corresponding inner queue has filled. In some examples, the outer queue threshold ($T_{OUTER}$) is set in the range of one to three entries, and in some particular examples, the outer queue threshold ($T_{OUTER}$) is set to one and in other particular examples, the outer queue threshold ($T_{OUTER}$) is set to two. In other examples, particularly if the outer queue is configured to hold a much larger number of entries, the outer queue threshold ($T_{OUTER}$) may be set to a much larger value. In some implementations, it may be desirable to determine an optimal value for the outer queue threshold ($T_{OUTER}$) by, for example, conducting experiments on test systems to determine a value for the outer queue threshold ($T_{OUTER}$) that optimizes overall read efficiency. However, in other examples, for simplicity and ease of design and implementation, the value for ($T_{OUTER}$) is just set to a fixed value (such as one) during the design phase of the system. It is also noted that, in an alternative implementation where the die manager is capable of directly counting the number of entries in both the inner and outer queues (i.e. both the inner and outer queues are visible to the die manager), then the die manager may be instead configured to compare the total queue entry count against a suitable threshold.

Figure 8:
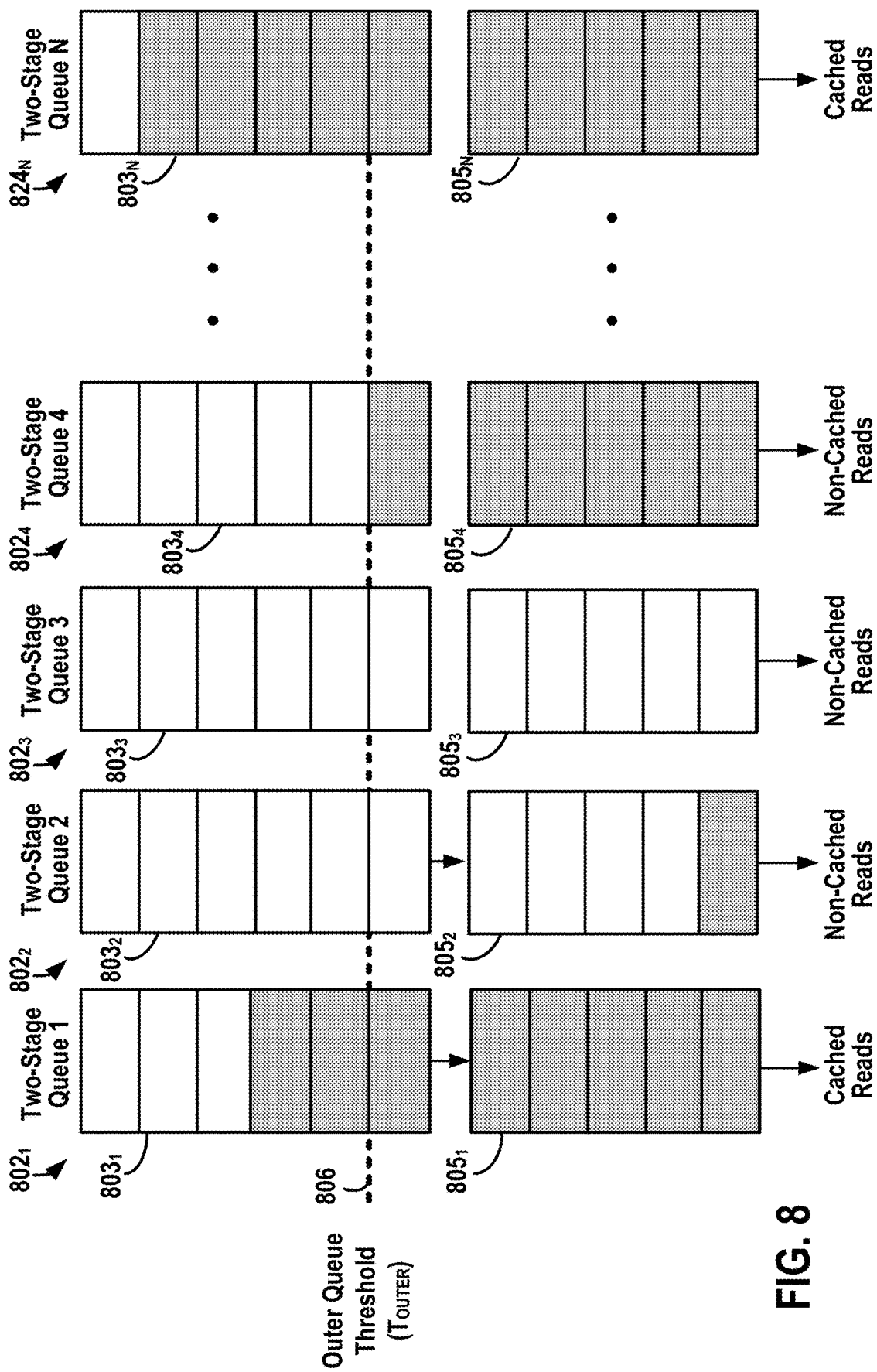
FIG. 8 illustrates the use of a single threshold for a set of two-stage read request queues, where the threshold is applied only to the outer (visible) queue of each two-stage queue.

FIG. 8 illustrates the use of a single outer queue threshold ($T_{OUTER}$) 806 for a set of N read two-stage request queues $802_{1-N}$ each having an outer queue $803_{1-N}$ and an inner queue $805_{1-N}$. In each case, the outer queue $803_{1-N}$ is sized to store up to six entries and the inner queue $805_{1-N}$ is sized to store up to five entries, for a total of eleven entries. As already explained, a particular outer queue does not begin to fill until the corresponding inner queue has already filled completely. In the example of FIG. 8, the threshold ($T_{OUTER}$) 806 is set to one entry. For the case of Two-Stage Queue 1 $802_1$, the inner queue $805_1$ is full and the outer queue $803_1$ has three entries and so, for that particular queue and its corresponding die, cached reads are employed by the die manager to read data from the corresponding die. For the case of Two-Stage Queue 2 $802_2$, there is only one entry in the inner queue $805_2$ and none in the outer queue $803_2$ and so, for the corresponding die, non-cached reads are employed by the die manager to read data from the corresponding die. For the case of Two-Stage Queue 3 $802_3$, there are no entries in either the inner queue $805_3$ and none in the outer queue $803_3$ and so, for that particular die, non-cached reads are also employed. For the case of Two-Stage Queue 4 $802_4$, the inner queue $805_4$ is full and the outer queue $803_4$ has only one entry and so non-cached reads are also employed by the die manager to read data from that corresponding die. For the case of Queue N $804_N$, the inner queue $805_N$ is full and the outer queue $803_N$ has five entries and so cached reads are employed by the die manager to read data from that particular die.

Figure 9:
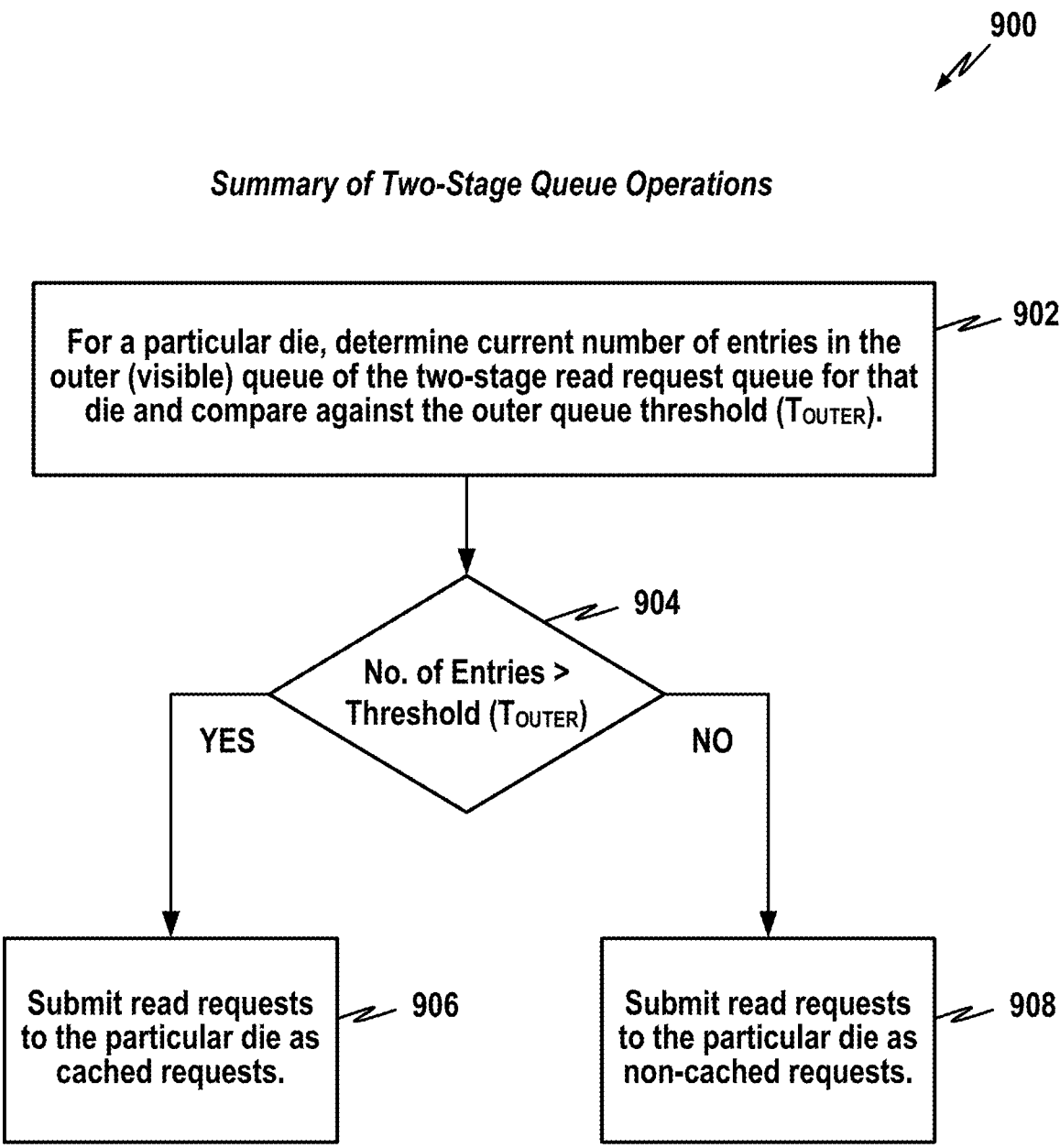
FIG. 9 is a flowchart summarizing the two-stage queue operations of FIGS. 7-8.

FIG. 9 is a flowchart that broadly summarizes the two-stage queue operations or procedures 900 of FIGS. 7 and 8. Briefly, at 902, the die manager (or other suitable component of the data storage controller) determines, for a particular die, the current number of entries in the outer (i.e. visible) queue of the two-stage read request queue for that die and compares against a two-stage outer queue threshold ($T_{OUTER}$). If, at the decision block 904, the number of entries is found to exceed the threshold ($T_{OUTER}$), then, at block 906, the die manager submits read requests to the particular die as cached requests. Otherwise, at block 908, the die manager submits the read requests to the particular die as non-cached requests. As already explained, this logic may be applied to each die of a multi-die system where the die has its own two-stage queue associated with the die.

Although described primarily with respect to data read operations, aspects of the queue-based cache/non-cache decisions described herein may be applicable to other operations performed by a data storage controller. In general, the queue-based decision logic may be advantageously applied in circumstances where there may be a bottleneck within a data processing system either upstream from a queue or downstream from the queue, and where the number of entries in the queue can provide an indication of where the bottleneck is so as to select a preferred course of action to resolve the bottleneck. Although comparing the number of entries in a queue against a fixed threshold (as in the examples described above) may offer considerable advantages in terms of implementation simplicity, it should be appreciated that additional or alternative queue fill-based procedures may be exploited, such as procedures that use adaptively or dynamically adjustable thresholds or procedures that take into account how quickly the number of entries is increasing or falling, or other dynamic factors.

In the following section, an exemplary NVM embodiment will be described in greater detail. To provide a concrete example, many details of a particular NVM system are provided, but it should be understood that the cache/non-cache selection features described herein may be implemented in a wide range of devices for a wide range of applications. In the following example, the die manager is a component of a data management module of a controller, but, in other implementations, the die manager might be configured differently. In still other examples, the cache/ non-cache selection functions may be performed by other components. A die manager is not required to implement the features described herein.

Exemplary Non-Volatile Memory (NVM) System with Die Manager

FIGS. 10-14 illustrate and summarize various selected features of an exemplary NVM system employing one or more die managers.

Figure 10:
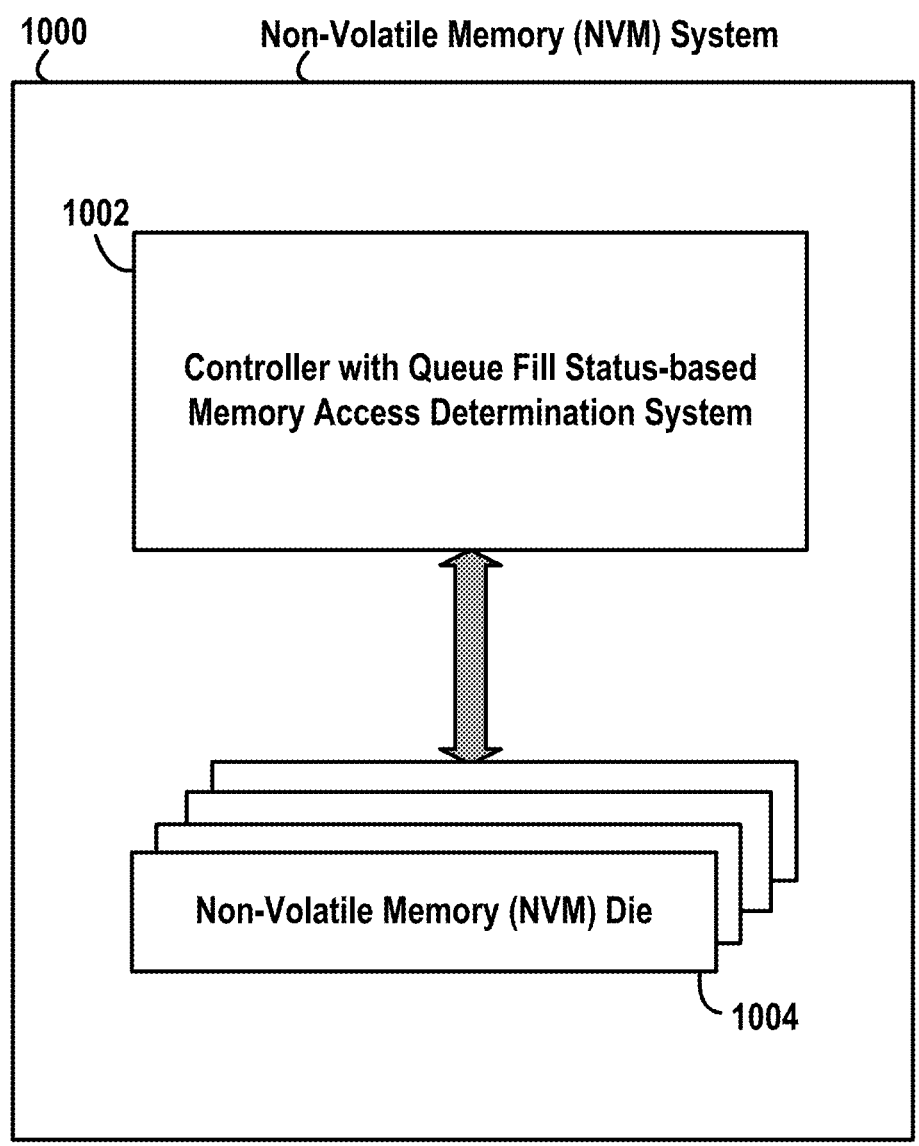
FIG. 10 is a block diagram of an example non-volatile memory (NVM) system having a controller with a queue fill status-based memory access determination system.

Briefly, FIG. 10 is a block diagram illustrating an exemplary NVM system 1000 in which the various systems and methods disclosed herein may be used. The NVM system 1000 includes a controller 1002 with a queue fill status-based memory access determination system and one or more NVM die 1004. As used herein, the term die may refer to the set of NVM cells, and the associated circuitry for managing the physical operation of the NVM cells, that are formed on a single semiconductor substrate. Controller 1002 interfaces with a host system or device (such as the host device shown in FIG. 1) and transmits command sequences for read, program, and erase operations to an NVM die 1004.

The controller 1002 (which may be a flash memory controller) can take the form of processing circuitry, a microprocessor or processor, and/or a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 1002 can be configured with hardware and/or firmware to perform the various functions described herein and shown in the flow diagrams. Also, some of the components shown as being internal to the controller can also be stored external to the controller, and other components can be used. Additionally, the phrase "operatively in communication with" can mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have functionality in addition to the specific functionality described herein. For example, the flash memory controller can format the flash memory to ensure the memory is operating properly, map bad flash memory cells, and allocate spare cells to be substituted for future failed cells. Some portion of the spare cells can be used to hold firmware to operate the flash memory controller and implement other features. In operation, when a host needs to read data from or write data to the flash memory, it communicates with the flash memory controller. If the host provides a logical address to which data is to be read/written, the flash memory controller converts the logical address received from the host to a physical address in the flash memory. (Alternatively, the host can provide the physical address). The flash memory controller can also perform various memory management functions, such as wear leveling (i.e. distributing writes to avoid wearing out specific blocks of memory that would otherwise be repeatedly written to) and garbage collection (i.e. after a block is full, moving only valid pages of data to a new block, so the full block can be erased and reused).

An NVM die 1004 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory technologies, now known or later developed. Also, the memory cells can be arranged in a two-dimensional or three-dimensional fashion (as will be discussed further below).

The interface between controller 1002 and NVM die 1004 may be any suitable flash interface, such as a suitable toggle mode. In one embodiment, memory system 1000 may be a card-based system, such as a secure digital (SD) or a micro secure digital (micro-SD) card. In an alternate embodiment, memory system 1000 may be part of an embedded memory system.

Although, in the example illustrated in FIG. 10, NVM system 1000 includes a single channel between controller 1002 and NVM die 1004, the subject matter described herein is not limited to having a single memory channel. For example, in some NAND memory system architectures, two, four, eight or more NAND channels couple the controller and the NAND memory device, depending on controller capabilities. In any of the embodiments described herein, more than a single channel may be used between the controller and the memory die, even if a single channel is shown in the drawings. The controller 1002 may be implemented in a single integrated circuit chip and may communicate with different layers of memory in the NVM die 1004 over one or more command channels.

Figure 11:
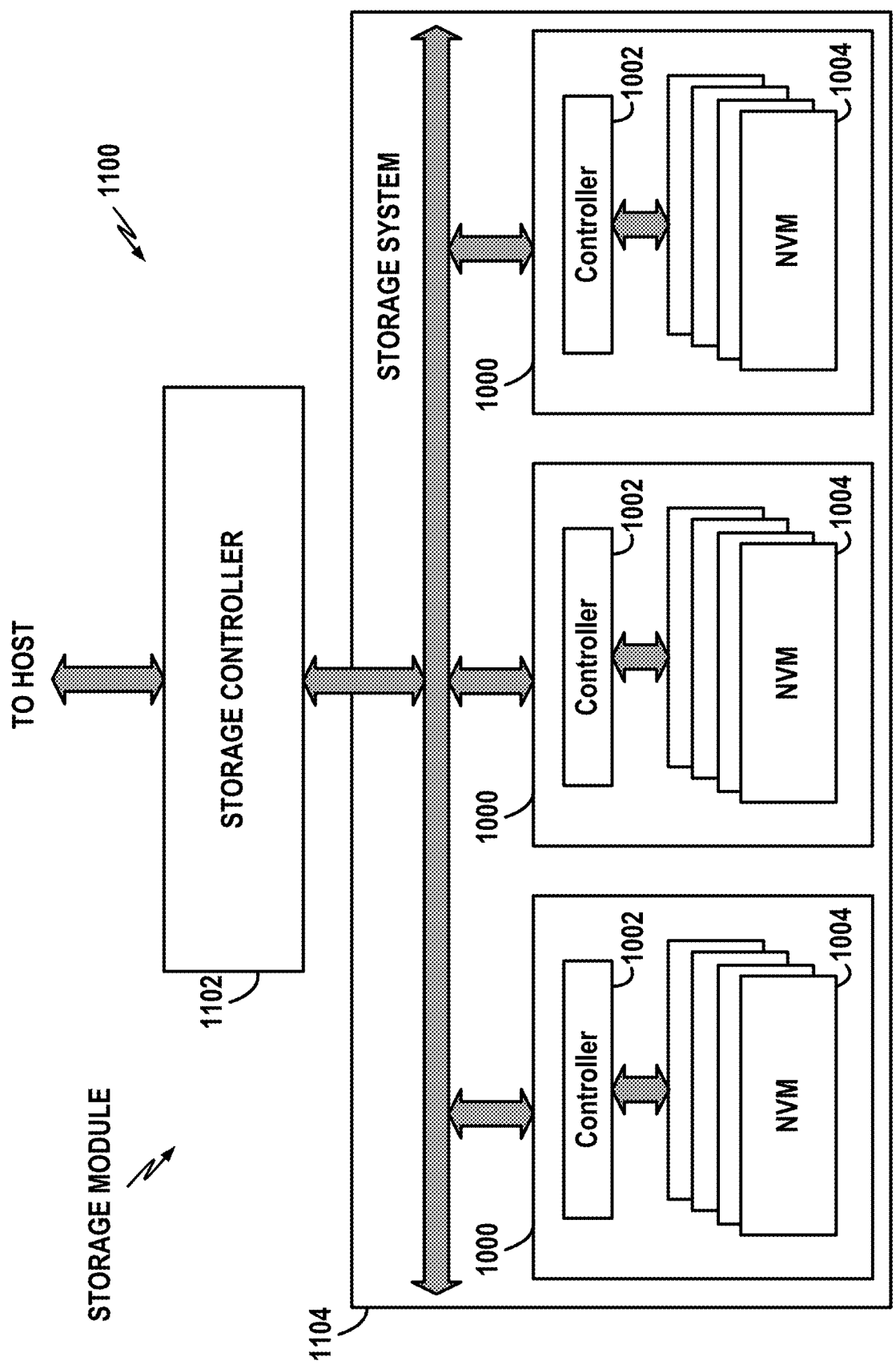
FIG. 11 is a block diagram illustrating an exemplary storage module with multiple NVM systems each having a controller with a queue fill status-based memory access determination system, as in FIG. 10.

FIG. 11 illustrates a storage module 1100 that includes plural NVM systems 1000. As such, storage module 1100 may include a main storage controller 1102 that interfaces with a host and with a storage system 1104, which includes a plurality of NVM systems 1000. The interface between storage controller 1102 and NVM systems 1000 may be a bus interface, such as a serial advanced technology attachment (SATA) or peripheral component interface express (PCIe) interface. Storage module 1100, in one embodiment, may be a solid state drive (SSD), such as found in portable computing devices, such as laptop computers, and tablet computers.

Figure 12:
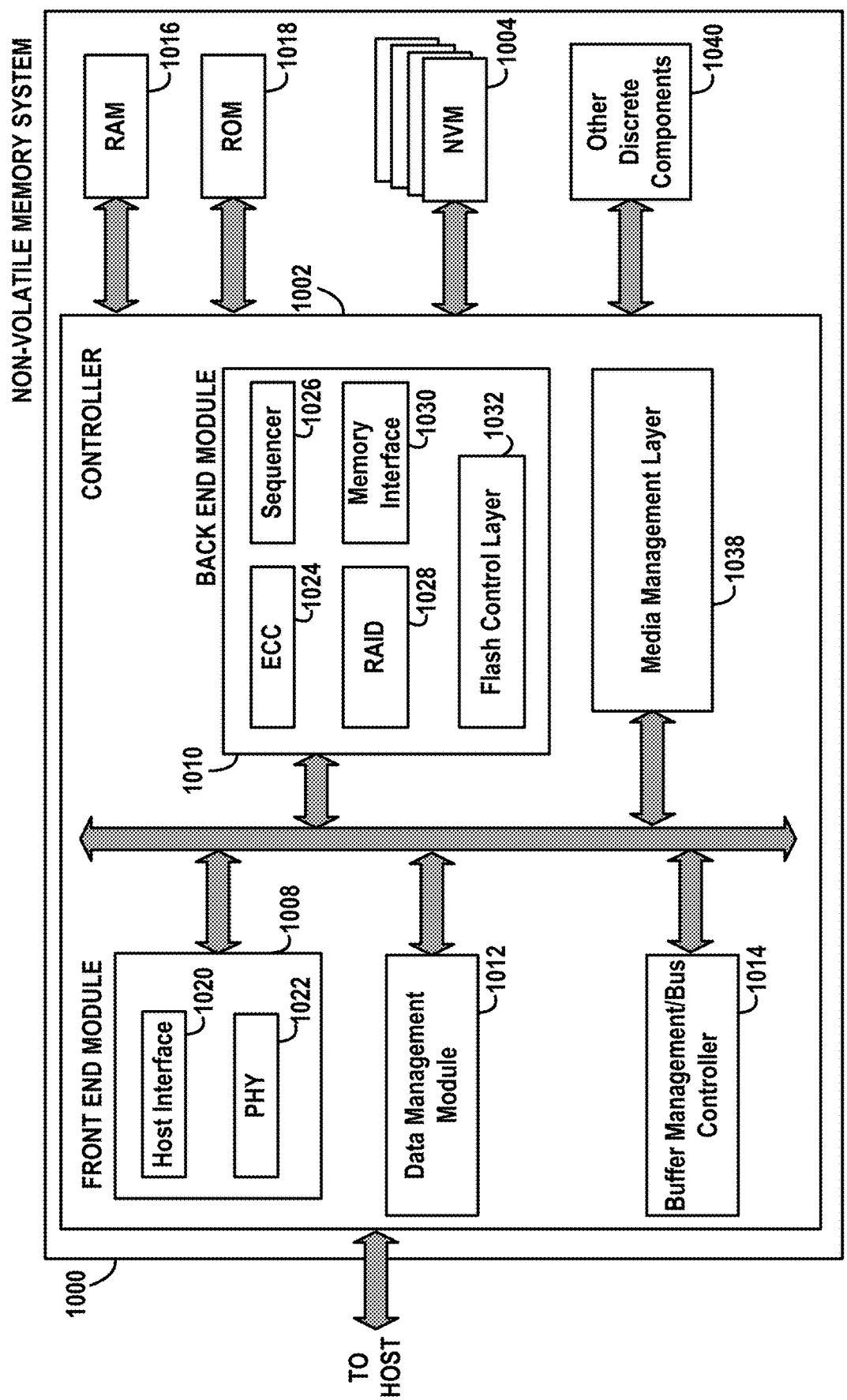
FIG. 12 is a block diagram illustrating exemplary components of the controller of the NVM system of FIG. 10.

FIG. 12 is a block diagram illustrating exemplary components of controller 1002 of FIG. 10 in more detail. Controller 1002 includes a front end module 1008 that interfaces with a host, a back end module 1010 that interfaces with the one or more NVM die 1004, and various other modules that perform functions which will be described below. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Modules of the controller 1002 may include a data management module 1012 present on the die of the controller 1002. The data management module 1012 handles the scheduling of maintenance and host write operations in a schedule cycle for the NVM such that the schedule cycle balances consumption of space with creation of free space. In embodiments having a NVM with a plurality of NVM die, the NVM die may be operated asynchronously and independently such that multiple NVM die may concurrently have schedule cycles balancing consumption and creation of free space in each respective NVM die. The data management module 1012 may include one or more die managers, described below.

Referring again to modules of the controller 1002, a buffer manager/bus controller 1014 manages buffers in random access memory (RAM) 1016 and controls the internal bus arbitration of controller 1002. A read only memory (ROM) 1018 stores system boot code. Although illustrated in FIG. 12 as located separate from the controller 1002, in other embodiments one or both of the RAM 1016 and the ROM 1018 may be located within the controller. In yet other embodiments, portions of RAM and ROM may be located both within the controller 1002 and outside the controller 1002. Further, in some implementations, the controller 1002, RAM 1016, and ROM 1018 may be located on separate semiconductor die.

Front end module 1008 includes a host interface 1020 and a physical layer interface (PHY) 1022 that provide the electrical interface with the host or next level storage controller. The choice of the type of host interface 1020 can depend on the type of memory being used. Examples of host interfaces 1020 include, but are not limited to, SATA, SATA Express, SAS, Fibre Channel, USB, PCIe, and NVMe. The host interface 1020 typically facilitates transfer for data, control signals, and timing signals.

Back end module 1010 includes an error correction controller (ECC) engine 1024 that encodes the data bytes received from the host, and decodes and error corrects the data bytes read from the NVM. A low level command sequencer 1026 generates command sequences, such as program and erase command sequences, to be transmitted to NVM die 1004. A RAID (Redundant Array of Independent Drives) module 1028 manages generation of RAID parity and recovery of failed data. The RAID parity may be used as an additional level of integrity protection for the data being written into the NVM die 1004. In some cases, the RAID module 1028 may be a part of the ECC engine 1024. A memory interface 1030 provides the command sequences to NVM die 1004 and receives status information from NVM die 1004. In one embodiment, memory interface 1030 may be a double data rate (DDR) interface. A flash control layer 1032 controls the overall operation of back end module 1010.

Additional components of system 1000 illustrated in FIG. 12 include media management layer 1038, which performs wear leveling of memory cells of NVM die 1004. System 1000 also includes other discrete components 1040, such as external electrical interfaces, external RAM, resistors, capacitors, or other components that may interface with controller 1002. In alternative embodiments, one or more of the physical layer interface 1022, RAID module 1028, media management layer 1038 and buffer management/bus controller 1014 are optional components that are not necessary in the controller 1002.

Figure 13:
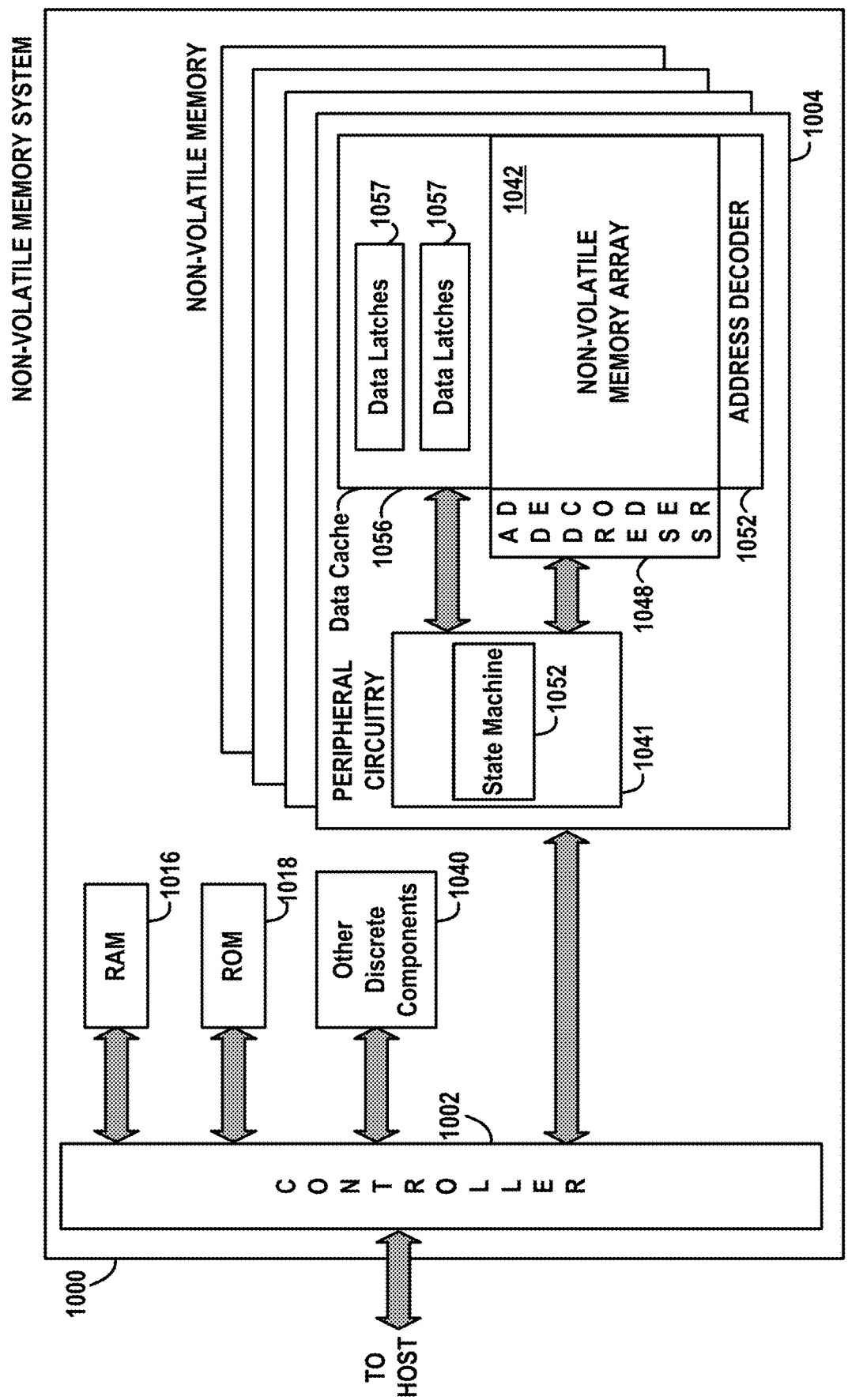
FIG. 13 is a block diagram illustrating exemplary components of the NVM of the NVM system of FIG. 10.

FIG. 13 is a block diagram illustrating exemplary components of NVM die 1004 in more detail. NVM die 1004 includes peripheral circuitry 1041 and NVM array 1042. NVM array 1042 includes the NVM cells (not individually shown) used to store data. The NVM cells may be any suitable NVM cells, including NAND flash memory cells and/or NOR flash memory cells in a two dimensional and/or three dimensional configuration. Peripheral circuitry 1041 includes a state machine 1052 that provides status information to controller 1002. NVM die 1004 further includes a data cache 1056 that caches data (and which may be employed when cached reads are selected). The data cache comprises sets of latches 1057 for each bit of data in a memory page of the NVM array 1042. Thus, each set of latches 1057 is a page in width and a plurality of sets of latches 1057 may be included in the data cache 1056. In circumstances where cache reads are selected, the data cache 1056 is activate to facilitate the cached reads. In circumstances where non-cache reads are selected, the data cache 1056 is typically not used. Additional or alternative cache components may be employed for performing cache reads, depending upon the implementation of the NVM system 1000.

Figure 14:
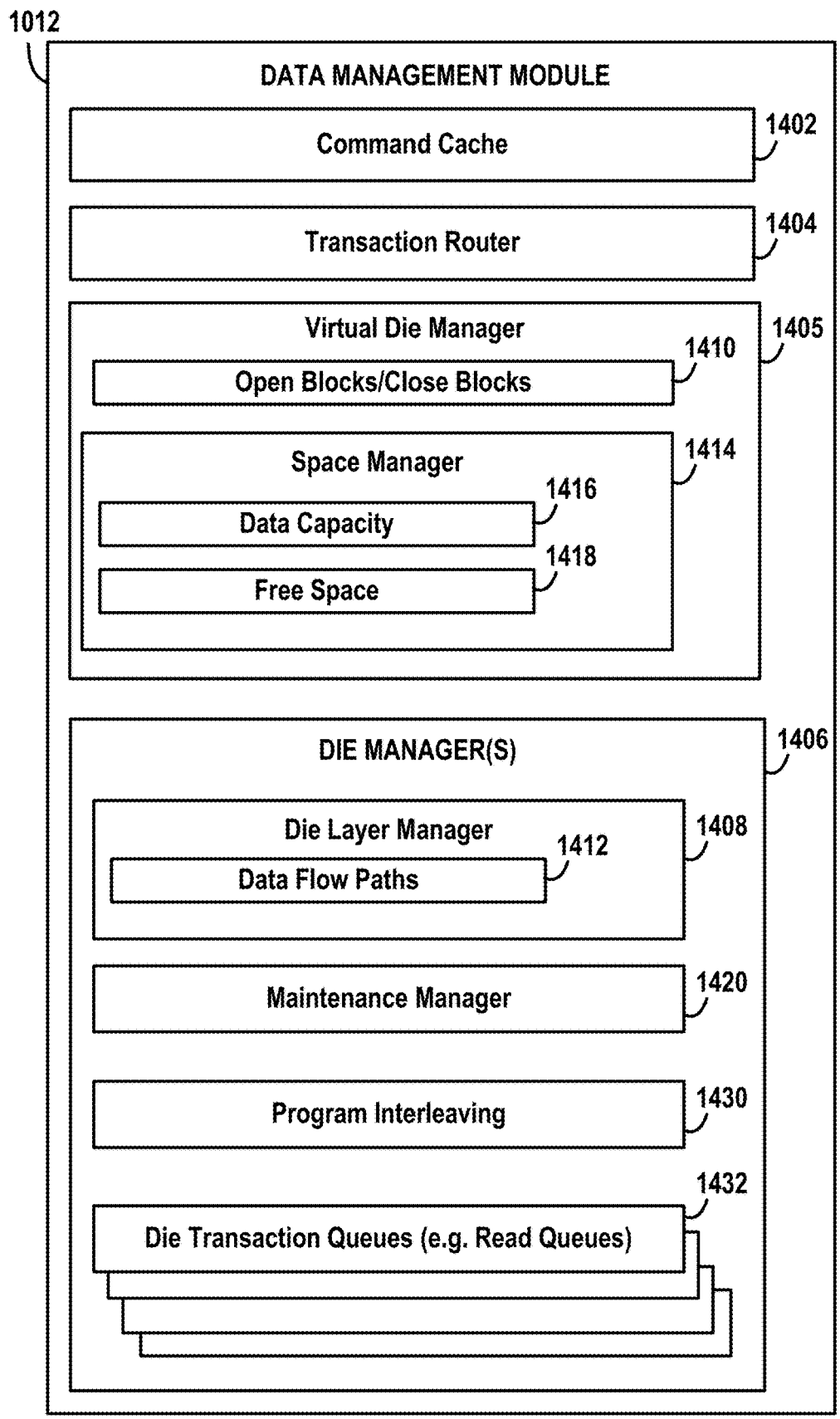
FIG. 14 illustrates an exemplary embodiment of a data management module having a die manager for use with the NVM system of FIG. 12.

Referring to FIG. 14, a more detailed illustration of the data management module 1012 of FIG. 12 is shown. The data management module 1012 may be configured as firmware, hardware, or a combination of the two to execute data management algorithms or procedures. As noted previously, the data management module 1012 may be part of or outside of the media management layer 1038 (FIG. 12) in the controller. In the example of FIG. 14, the data management module 1012 includes a command cache 1402 for containing or storing pending host commands from the command manager layer. A transaction router 1404 is configured to route transactions to a selected NVM die in the bank of dies.

A virtual die manager 1405 is provided, which may include (or correspond to) an internal flash translation layer (FTL) and a block management (BM) component. Among other functions, the virtual die manager 1405 translates a host command address to a virtual die address and feeds the result into a die manager 1406. In the example of FIG. 2, the virtual die manager 1405 includes a space manager 1414 that includes information on the data capacity 1416 and free space 1418 available in each die layer of any dies associated with the data management module 1012. The free space 1418 may be in the form of a free block list for each die layer in the NVM die being managed. In the example of FIG. 2, the virtual die manager 1405 also includes an open blocks/close blocks 1410 component. A die layer manager 1408 (discussed below) of the die manager 1406 is aware of any such open block list and assigns NAND operation accordingly when accessing open blocks/closed blocks. However, in this particular example, the die layer manager 1408 does not manage the opening and closing of the blocks. Both the virtual die manager 1405 and the die manager 1406 have (or can access) a maintenance manager 1420 though a different level of the module. Note that in systems that do not have a virtual die manager, functions such as the space manager functions or the opening/closing block functions may be implemented by a suitably equipped die manager.

As noted, one or more die managers 1406 are provided. In the example of FIG. 14 (as in the examples of FIGS. 2 and 7), a single die manager is provided to manage all dies (along with the aforementioned virtual die manager 1405). However, in some implementations, a separate die manager 1406 is provided for each NVM die being managed by the data management module 1012. For example, if one data management module 1012 is associated with a bank, where the bank is configured as the column of four NVM die 1004 associated with channel 0, then four instances of the die manager 1406—one for each die in the bank—may be provided in the data management module 1012 for channel 0. Whether single or plural die managers are used, the single or plural die manager(s) may be equipped to perform the various methods described above, to decide, for example, on a die-by-die basis whether to employ cache reads or non-cache reads based on queue fill status. Within die manager 1406, a die layer manager 1408 manages the data flows within and between die layers for a particular NVM die by, for example, maintaining and using a list of possible data flow paths 1412. The types of data flow paths 1412 supported may vary based on the type of NVM die. The maintenance manager 1420 may handle maintenance operations. If program interleaving is employed, a program interleaving controller 1430 may be provided.

One or more die transaction queues 1432 are provided to buffer host read, program and erase transactions for execution in the low level command sequencer 1026 of the back end module of FIG. 12. The die transaction queues 1432 may include the above-described read request queues. The queues 1432 (which may include separate individual queues for each die, as already explained) include lists of pending host commands that are awaiting execution on the NVM die and may be used, as described above, to select between cached reads or non-cached reads (with the cached reads processed using the data cache 1056 of FIG. 13). Although shown in FIG. 14 as components of the die manager 1406, the queues may be separate from the die manager as shown in FIGS. 2 and 7.

As explained above, in some examples each queue is a two-stage queue. In such examples, the queues 1432 of FIG. 14 represent only the "outer" or "second" queues (i.e. the portions of each two-stage queue that the die manager has visibility to). The other queues (i.e. the "first" or "inner" queues within the data path that the die manager does not have direct access to) are not shown in FIG. 14.

As also explained above, the die manager may include various components to determine whether to employ cached reads or non-cached reads. By way of example, although not explicitly shown in FIG. 14, the die manager 1406 of FIG. 14 may include one or more single-stage queue entry counters 208 (as shown in FIG. 2) to separately count and track the number of values or entries in each of the queues 1432. One or more queue entry/threshold comparators 210 may be used by the die manager 1406 to compare the queue entry count for a particular queue 1432 against the queue threshold value (T). One or more cached read submission controllers 212 may be used by the die manager 1406 to submit reads to particular dies as cached reads (if the queue entry count of the queue for the particular die exceeds the queue threshold value (T)). One or more non-cached read submission controllers 214 may be used by the die manager 1406 to submit reads to particular dies as non-cached reads (if the queue entry count of the queue for the particular die does not exceed the threshold value (T)).

As another example, the die manager 1406 of FIG. 14 may include one or more outer-stage queue entry counters 708 (as shown in FIG. 7) configured to separately count and track the number of values or entries in each of the queues 1432 (in examples where the queues 1432 are just the visible portions of the overall two-stage submission queues). One or more queue entry/threshold ($T_{OUTER}$) comparators 710 may be used by the die manager 1406 to compare the queue entry count for a particular queue 1432 against the queue threshold value ($T_{OUTER}$). One or more cached read submission controllers 712 may be used by the die manager 1406 to submit reads to particular dies as cached reads (if the queue entry count of the queue 1432 for the particular die exceeds the two-stage queue threshold value ($T_{OUTER}$)). One or more non-cached read submission controllers 714 may be used by the die manager 1406 to submit reads to particular dies as non-cached reads (if the queue entry count of the queue 1432 for the particular die does not exceed ($T_{OUTER}$).

Again, a separate instance of a data management module 1012 may be provided for each memory bank in the system, where a memory bank comprises a subset of the total number of physical die in the NVM system 1000 (e.g. all die on a whole number of channels). The data management module 1012 may map a predefined subset of logical address space (a logical bank) to a predefined subset of physical address space (a physical bank). Alternatively, a single instance of the data management module 1012 may manage all die in the system 1000, which is equivalent to there being only a single bank, both logical and physical. The data management module 1012 maps a unique logical address space to a unique physical address space comprising an integral number of die. It may be desirable to produce uniformity of response times to commands within any host workload while avoiding idle time in NVM die. In some examples, a data management algorithm or procedure executed by the data management module 1012 may utilize the NVM die asynchronously and independently to increase the utilization of NVM die and to assist with overall performance of the NVM system.

Further Features and Exemplary Embodiments

FIGS. 15-20 illustrate and summarize various general features of exemplary data storage controllers and methods, or procedures for use with data storage controllers.

Figure 15:
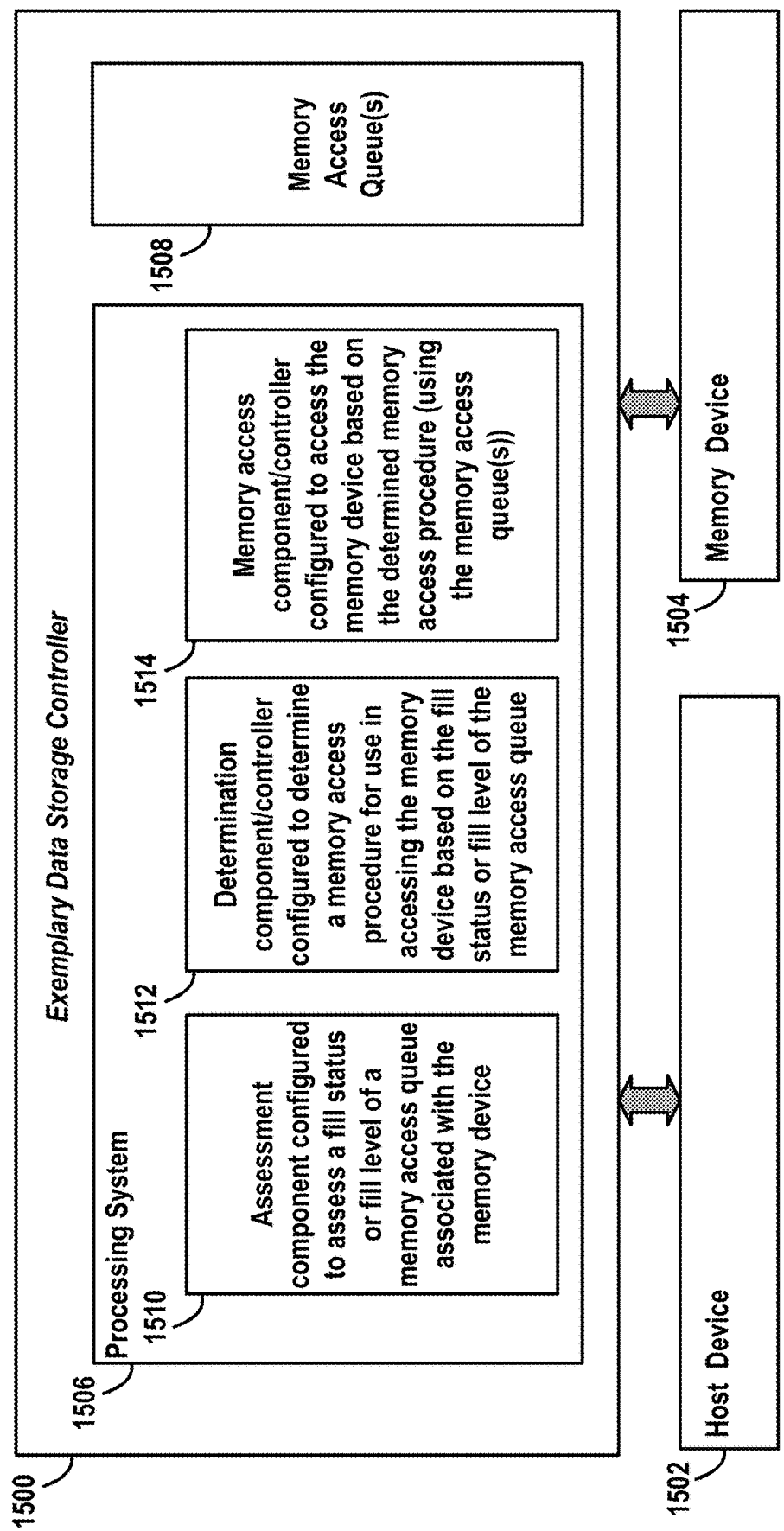
FIG. 15 is a block diagram summarizing selected features of a data storage controller equipped to assess a fill status of a memory access queue and to determine a memory access procedure based on the fill status of the memory access queue.

FIG. 15 shows an exemplary data storage controller 1500 (or memory controller) configured to communicate with a host device 1502 and a data storage device or other memory device 1504. Although many examples described herein relate to NVM controllers for storing data within NAND devices with multiple dies, the memory device 1504 may be any suitable memory or storage device and is not limited to NANDs, and the data storage controller 1500 may be any suitable memory controller device and is not limited to NVM-based controllers.

The exemplary data storage controller 1500 of FIG. 15 includes a processor or processing system 1506 for controlling the storage, retrieval and/or erasure of data within the memory device 1504 based on commands from the host device 1502. The data storage controller 1500 also includes one or more memory access queues 1508 for use in relaying commands to the data storage device 1504, i.e. the memory access queue 1508 is associated with or corresponds to the memory device 1504 (or a respective die within the memory device 1504). In the example of FIG. 15, the processing system 1506 includes an assessment component or controller 1510 configured to determine or otherwise assess a fill status or fill level of the memory access queue 1508 associated with the memory device, using techniques or procedures described above. The assessment controller 1506 also may be referred to as a "queue assessment component." The assessment component 1510 may be configured as hardware, firmware, software, or some combination thereof, and may include or comprise a machine readable medium having stored thereon of machine executable instructions that, when executed by the processing system 1506, control the processing system to perform the assessment functions.

The processing system 1506 also includes a determination component or controller 1512 configured to determine (or otherwise detect or identify or select) a memory access procedure for use in accessing the memory device 1504 based on the fill status or fill level of the memory access queue 1508. The determination controller 1506 also may be referred to as a "memory access determination component/controller." As already explained, such a determination may be performed to select between a cached read memory access procedure and a non-cached read memory access procedure based on the number of entries in a read access queue. The determination component 1512 may be configured as hardware, firmware, software, or some combination thereof, and may include or comprise a machine readable medium having stored thereon machine executable instructions that, when executed by the processing system 1506, control the processing system to perform the determination functions.

Still further, the processing system 1506 also includes a memory access component or controller configured to access the memory device 1504 based on the determined memory access procedure (using the memory access queue(s) 1508. As already explained, access may be achieved by submitting read commands either as cached reads or non-cached reads via a suitable read access queue. The memory access component 1514 may be configured as hardware, firmware, software, or some combination thereof, and may include or comprise a machine readable medium having stored thereon machine executable instructions that, when executed by the processing system 1506, controls the processing system to access the memory based on the determined memory access procedure.

In at least some examples, means may be provided for performing the functions illustrated in FIG. 15 and/or other functions illustrated or described herein. For example, an apparatus (e.g. processing system 1506) may be provided for use with a memory device (e.g. memory device 1504) where the apparatus includes: means for assessing a fill status of a memory access queue associated with a memory device and/or for determining a number of entries in a memory access queue associated with a memory device (such as assessment component 1510); means for determining a memory access procedure for use in accessing the memory device based on the fill status of the memory access queue and/or based on the number of entries in the memory access queue (such as determination component 1512); and means for accessing the memory device based on the determined memory access procedure (such as memory access component 1514).

In some examples, the means for determining the memory access procedure includes a means for determining whether to submit memory access operations to the memory device as cached operations or as non-cached operations based on the number of entries in a memory access queue (such as the data storage controller 108 with queue-based cache/non-cache memory access determination system of FIG. 1). The means for determining whether to submit memory access operations to the memory device as cached operations or as non-cached operations, may include: means for counting a number of entries in a single-stage queue (such as the counters 208 of FIG. 2) and means for comparing the number of entries in the single-stage queue to a single-stage queue threshold (such as the comparators 210 of FIG. 2). The means for accessing the memory device may include: means for submitting the memory access operations as cached operations if the number of entries in the single-stage queue exceeds the single-stage queue threshold (such as cached read submission controllers 212 of FIG. 2); and means for submitting the memory access operations as non-cached operations if the number of entries in the single-stage queue does not exceed the single-stage queue threshold (such as the non-cached read submission controllers 21 of FIG. 2).

The memory access queue may be a two-stage queue that includes first and second queues, the second queue receiving entries only if the first queue is full, as shown in FIGS. 7-8. In such an implementation, the means for determining whether to submit memory access operations to the memory device as cached operations or as non-cached operations may include: means for counting a number of entries in a second (outer) stage queue (such as the counters 708 of FIG. 7); and means for comparing the number of entries in the second (outer) queue to a second queue threshold (such as the comparators 710 of FIG. 7). The means for accessing the memory device may include: means for submitting the memory access operations as cached operations if the number of entries in the second (outer) queue exceeds the second (outer) queue threshold (such as the cached read submission controllers 712 of FIG. 7); and means for submitting the memory access operations as non-cached operations if the number of entries in the second (outer) queue does not exceed the second (outer) queue threshold (such as the non-cached read submission controllers 714 of FIG. 7).

These are just some examples of suitable means for performing or controlling the various functions or operations described herein.

The subject matter described herein may be implemented in hardware, software, firmware, or any combination thereof. As such, the terms "function" "node" or "module" as used herein refer to hardware, which may also include software and/or firmware components, for implementing the feature being described. In one exemplary implementation, the subject matter described herein may be implemented using a computer readable medium having stored thereon computer executable instructions that when executed by the processor of a computer control the computer to perform steps. Exemplary computer readable media suitable for implementing the subject matter described herein include non-transitory machine- or computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

In at least some examples, a machine-readable storage medium may be provided having one or more instructions which when executed by a processing circuit causes the processing circuit to performing the functions illustrated in FIG. 15 and/or other functions illustrated or described herein. For example, instructions may be provided for: assessing a fill status of a memory access queue associated with a memory device; and determining a memory access procedure for use in accessing the memory device based on the fill status of the memory access queue. The instructions for determining the memory access procedure may include instructions for selecting or choosing between a cached memory access procedure and a non-cached memory access procedure. The cached memory access procedure may be a cached read request and the non-cached memory access procedure is non-cached read request. The instructions for assessing the fill status of the memory access queue may include instructions for determining a number of entries in the memory access queue. The memory access queue may include a read request queue, and the instructions for determining the number of entries in the memory access queue may include instructions for determining the number of entries in the read request queue. The instructions for determining the memory access procedure may include instructions for determining whether to submit memory access operations to the memory device as cached operations or as non-cached operations based on the number of entries in the memory access queue.

In examples wherein the memory access queue is a single-stage queue, the instructions for determining the number of entries may include instructions performed to determine the number of entries in the single-stage queue. The instructions for determining whether to submit memory access operations to the memory device as cached operations or as non-cached operations may include instructions for: comparing the number of entries in the single-stage queue to a single-stage queue threshold; submitting the memory access operations as cached operations if the number of entries in the single-stage queue exceeds the single-stage queue threshold; and submitting the memory access operations as non-cached operations if the number of entries in the single-stage queue does not exceed the single-stage queue threshold.

In examples where the memory access queue is a two-stage queue that includes first and second queues, the second queue receiving entries only if the first queue is full, the instructions determining the number of entries may include instructions to determine the number of entries in the second queue. The instructions for determining whether to submit memory access operations to the memory device as cached operations or as non-cached operations may include instructions for: comparing the number of entries in the second queue to a second queue threshold; submitting the memory access operations as cached operations if the number of entries in the second queue exceeds the second queue threshold; and submitting the memory access operations as non-cached operations if the number of entries in the second queue does not exceed the second queue threshold.

The data storage controller may include a die manager, where the die manager performs the instructions to assess the fill status of the memory access queue and to determine the memory access procedure based on the fill status of the memory access queue. The memory device may include a plurality of physical memory dies with a separate memory access queue for each die, where the die manager performs the instructions to determine the number of entries in each separate memory access queue and to separately determine, on a queue-by-queue basis, whether to submit memory access operations to a particular die as cached operations or as non-cached operations based on the number of entries in the memory access queue for the particular die. As noted, the memory device may be an NVM, and, if so, the instructions for determining the memory access procedure for use in accessing the memory device may include instructions for determining an NVM memory access procedure for accessing the NVM.

These are just some examples of suitable instructions for performing or controlling the various functions or operations described herein.

Figure 16:
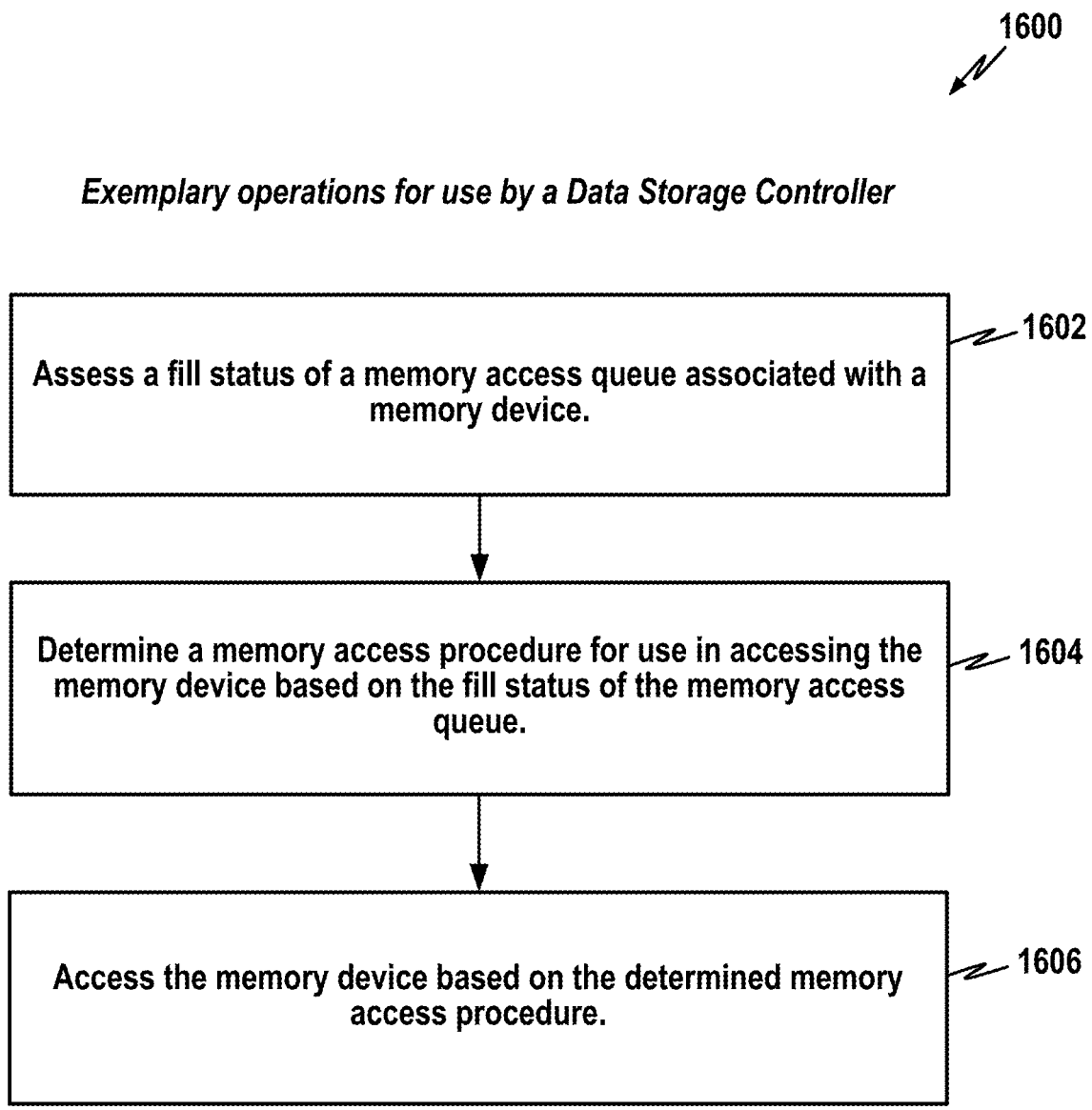
FIG. 16 is a high-level flow chart summarizing selected operations of a data storage controller equipped to assess a fill status of a memory access queue and to determine a memory access procedure based on the fill status of the memory access queue.

FIG. 16 broadly summarizes exemplary operations 1600 for use by or with a data storage controller or other suitable device to process completion values. At 1602, the data storage controller assesses a fill status of a memory access queue associated with a memory device, and, at 1604, the data storage controller determines a memory access procedure for use in accessing the memory device based on the fill status of the memory access queue. As already discussed, in some examples, the determination may be performed by selecting between a cached read operation (or procedure) and a non-cached read operation (or procedure) based on a number of entries in one or more memory access queues. At 1606, the data storage controller then accesses the memory device based on the determined memory access procedure.

FIG. 17 further summarizes exemplary operations 1700 for use by or with a data storage controller or other suitable device in a multi-die system with single stage queues. At 1702, the data storage controller assesses the fill status of each of a set of single-stage memory access queues (e.g. a read request queues) associated with a set of dies of an NVM device (such as NAND dies) by using a die manager to separately count (or otherwise determine or input) the number of entries in each separate single-stage memory access queue for each respective die. This may include receiving a signal from another component indicative of the number of entries in the queue.

At 1704, the data storage controller separately determines, on a queue-by-queue basis, whether to submit memory access operations to a particular NVM die as cached operations or as non-cached operations based on (a) the number of entries in the memory access queue for the particular die by using the die manager to compare the number of entries in the single-stage queue for a particular die to a single-stage queue threshold (T) used for all dies and/or (b) whether the particular die is in a true ready state. At 1706, the data storage controller accesses the particular die by: submitting the memory access operations to the particular die as cached operations if the number of entries in the single-stage queue for that die exceeds the single-stage queue threshold (T); and submitting the memory access operations to the particular die as non-cached operations (a) if the number of entries in the single-stage queue for the die does not exceed the single-stage queue threshold and/or (b) if cached operations were previously enabled, resuming non-cached operations if the corresponding queue becomes empty and/or the corresponding die has reached the true ready state.

Hence, in some examples, and as described in detail above, the device compares the number of entries in a queue to a threshold and then accesses the memory die using cached reads if the number of entries in the queue exceeds the threshold and accesses the memory die using non-cached reads otherwise. However, in other examples, once cached reads are enabled, the device continues to use cached reads until the queue is empty. In still other examples, once cached reads are enabled (for whatever reason), the device continues to use cached reads until the memory die has reached a true ready state. A "True Ready Status" may be used to indicate whether a current operation running in the flash memory device has finished, the memory array is free, and a different operation may be started. In some examples herein, hardware or other components associated with a particular memory die notify the appropriate firmware that the memory die has entered, or otherwise reached, the True Ready state (i.e. transitioned from "Busy" to "True Ready"). At that point, non-cached reads automatically resume. For devices already equipped to detect and respond to the True Ready state, the use of that state to trigger an automatic return to non-cached reads may offer at least some advantages over using a threshold to trigger the return or waiting until the corresponding queue is empty.

Thus, in at least some examples, the device does not compare the number of entries in a queue to a threshold but uses other mechanisms or criteria to decide whether to switch between cached and non-cached memory access operations.

FIG. 18 further summarizes exemplary operations 1800 for use by or with a data storage controller or other suitable device in a multi-die system with two-stage stage queues. At 1802, the data storage controller assesses the fill status of each of a set of two-stage memory access queues (e.g. a read request queues) associated with a set of dies of an NVM device (such as NAND dies)—where each two-stage queue includes a first (inner) and a second (outer) queue, the second (outer) queue receiving entries only if the first (inner) queue is full—by using a die manager that only has visibility to the second (outer) queue to separately count (or otherwise determine or input) the number of entries in each second (upper) queue for each respective die. This may include receiving a value from another component indicative of the number of entries in the second (outer) queue. At 1804, the data storage controller separately determines, on a queue-by-queue basis, whether to submit memory access operations to a particular NVM die as cached operations or as non-cached operations based on the number of entries in the second (outer) queue for the particular die by using the die manager to compare the number of entries in the second (outer) queue for a particular die to a second-stage queue threshold ($T_{OUTER}$) used for all dies (or by using other decision criteria such as a true ready status). At 1806, the data controller accesses the particular NVM die by: submitting the memory access operations to the particular die as cached operations if the number of entries in the second (outer) queue for that die exceeds the second-stage queue threshold ($T_{OUTER}$); and submitting the memory access operations to the particular die as non-cached operations if the number of entries in the second (outer) queue for the die does not exceed the second-stage queue threshold ($T_{OUTER}$), (or waiting until the entire queue is empty and/or a true ready state has been reached to resume non-cached operations if cached operations were previously enabled, as may be appropriate in systems that automatically deactivate cache usage if a queue becomes empty).

Figure 19:
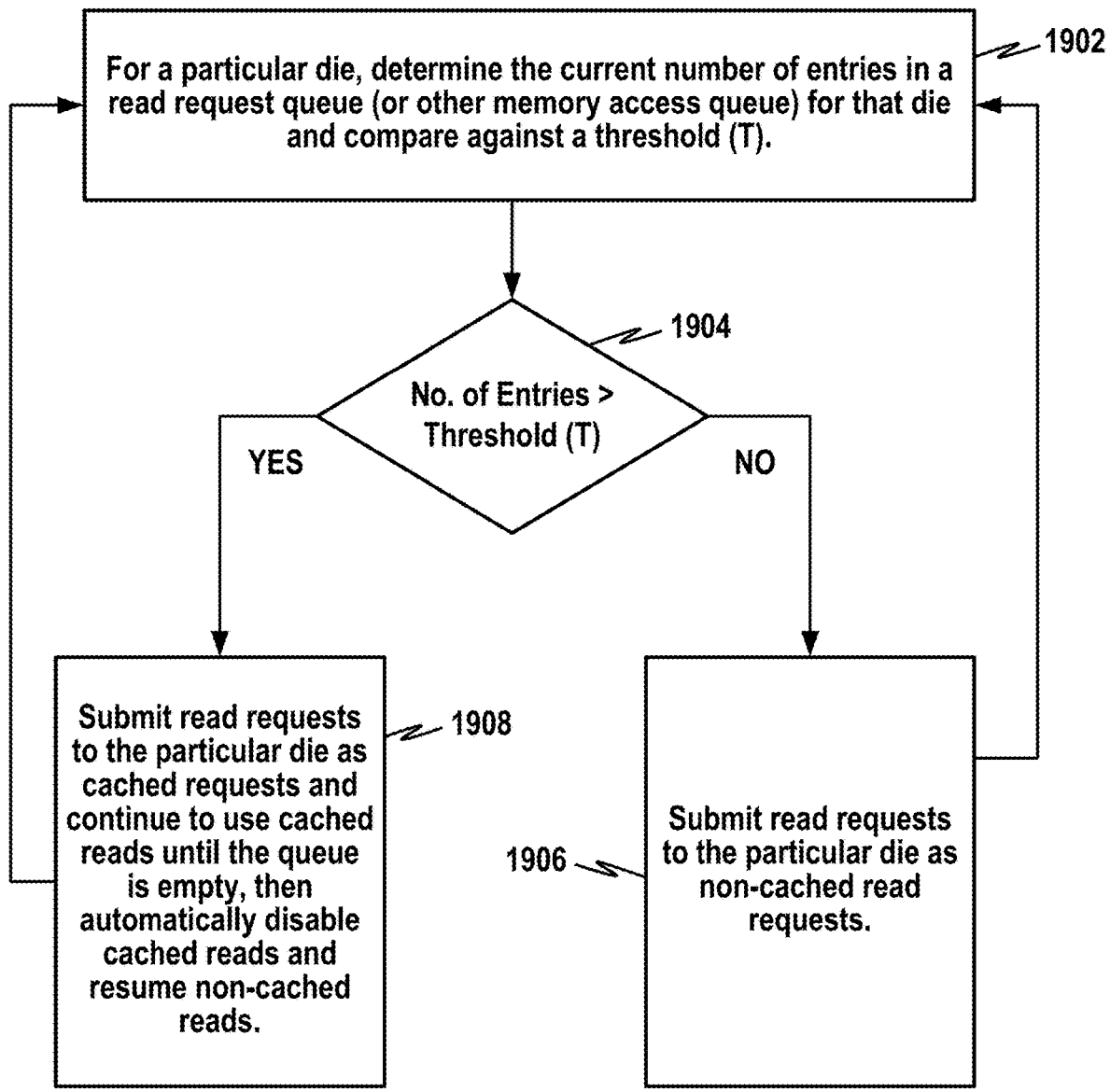
FIG. 19 is a flowchart summarizing methods in which cached reads are disabled automatically once a memory access queue becomes empty.

FIG. 19 summarizes methods 1900 in which cached reads are disabled automatically once a memory access queue becomes empty. In the example of FIG. 19, the queue may be a single-stage queue and the threshold may be the single-stage threshold discussed above. However, the general features of FIG. 19 are also applicable to two-stage queue implementations. Briefly, at 1902 the die manager (or other suitable component of the data storage controller) determines, for a particular die, the current number of entries in the read request queue for that die and compares against a queue threshold (T). If, at the decision block 1904, the number of entries is found to not exceed the threshold (T), then, at block 1906, the die manager submits read requests to the particular die as non-cached requests. Processing returns to block 1902 to once again count the number of entries in the queue. So long as the threshold is not exceeded, non-cached reads are performed via block 1906. However, once the threshold is exceeded, processing proceeds to block 1908, where read requests are submitted to the particular die as cached requests and the system continues to use cached reads until the queue is empty, then the system automatically disables cached reads and resumes non-cached reads (by returning to block 1902). Thereafter, non-cached reads continue until the threshold is again exceeded. The method of FIG. 19 is may be advantageously used in systems that are configured to automatically deactivate cache read circuitry when a queue becomes empty.

Figure 20:
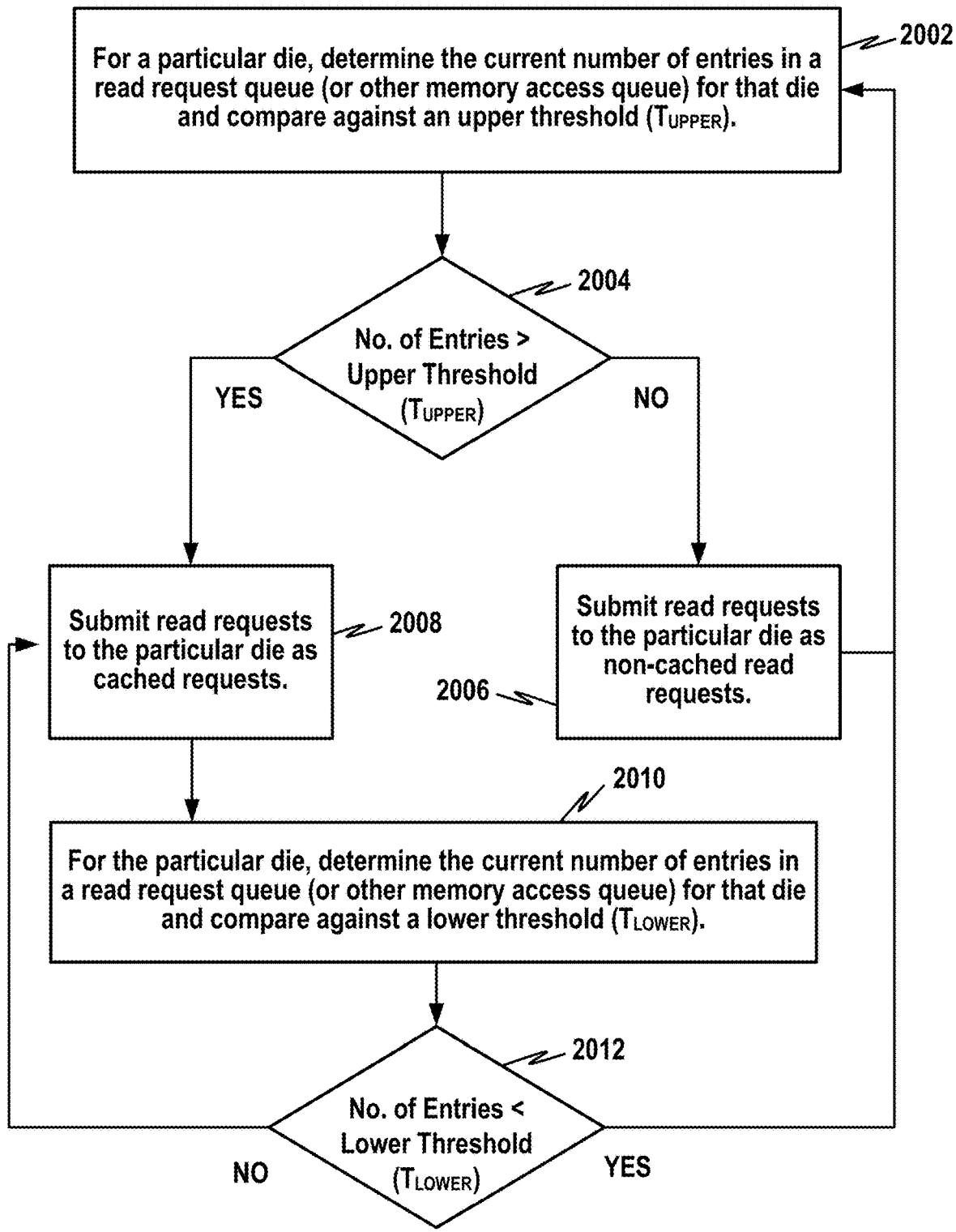
FIG. 20 is a flowchart summarizing methods in which cached reads are disabled once a memory access queue falls below a second lower threshold to avoid hysteresis issues.

FIG. 20 is summarizes methods 2000 in which cached reads are disabled once a memory access queue falls below a second lower threshold (and which may be advantageous for use in systems that do not automatically deactivate cached reads as in FIG. 19). In FIG. 20, the queue may be a single-stage queue and the threshold may be the single-stage threshold discussed above. As with FIG. 19, the general features of FIG. 20 are also applicable to two-stage queue implementations. Briefly, at 2002 the die manager (or other suitable component of the data storage controller) determines, for a particular die, the current number of entries in the read request queue for that die and compares against a first upper queue threshold ($T_{UPPER}$), which is greater than a second lower queue threshold ($T_{LOWER}$). If, at the decision block 2004, the number of entries is found not to exceed the upper threshold ($T_{UPPER}$), then, at block 2006, the die manager submits read requests to the particular die as non-cached requests. Processing returns to block 2002 to once again count the number of entries in the queue. So long as the upper threshold is not exceeded, non-cached reads are performed via block 2006. However, once the upper threshold is exceeded, processing proceeds to block 2008, where read requests are submitted to the particular die as cached requests.

Once cached reads begin, the die manager again determines, at 2010, the current number of entries in the read request queue, but the die manager now compares the count against the second lower queue threshold ($T_{LOWER}$), which is lower than the upper queue threshold ($T_{UPPER}$). So long as the count remains above the lower queue threshold ($T_{LOWER}$), as determined at decision block 2012, the die manager continues to use cached reads (submitted via block 2008). Eventually, once the count falls below the lower threshold ($T_{LOWER}$), processing returns to block 2006 (via blocks 2002 and 2004), and reads are again submitted as non-cached reads. In this manner, hysteresis issues may be avoided, which might otherwise occur if the system repeatedly switched back and forth between cached and non-cached reads while the count remained close to a single threshold value. In one particular example, where the maximum queue size is twelve, the upper threshold ($T_{UPPER}$) might be set to six whereas the lower threshold ($T_{LOWER}$) might be set to three. These values are merely illustrative.

The subject matter described herein can be implemented in any suitable NAND flash memory, including 2D or 3D NAND flash memory. Semiconductor memory devices include volatile memory devices, such as DRAM) or static random access memory ("SRAM") devices, nonvolatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured. The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon. The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements. One of skill in the art will recognize that the subject matter described herein is not limited to the two dimensional and three dimensional exemplary structures described but cover all relevant memory structures within the spirit and scope of the subject matter as described herein and as understood by one of skill in the art.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Various details of the presently disclosed subject matter may be changed without departing from the scope of the presently disclosed subject matter. Furthermore, the foregoing description is for the purpose of illustration only, and not for the purpose of limitation.

What is claimed is:

1. A method for use by a data storage controller, comprising:
    assessing a fill status of a memory access queue associated with a memory device, the memory device including a memory die with cache memory and non-cache memory;
    determining whether to submit memory access operations to the memory die as cached operations or as non-cached operations based on the fill status of the memory access queue; and
    submitting the memory access operations to the memory die as cached operations or as non-cached operations based on the determination.

2. The method of claim 1, wherein assessing the fill status of the memory access queue includes determining a number of entries in the memory access queue.

3. The method of claim 2, wherein the memory access queue includes a read request queue, and wherein determining the number of entries in the memory access queue includes receiving a value indicative of the number of entries in the read request queue.

4. The method of claim 1, wherein, if the memory access operations are submitted to the memory die as cached operations, automatically resuming non-cached submissions if the memory access queue becomes empty.

5. The method of claim 1,
    wherein the memory access queue is a single-stage queue; and
    wherein determining whether to submit the memory access operations to the memory die as cached operations or as non-cached operations includes comparing a number of entries in the single-stage queue to a single-stage queue threshold.

6. The method of claim 5, wherein submitting the memory access operations to the memory die comprises:
    submitting the memory access operations to the memory die as cached operations if the number of entries in the single-stage queue exceeds the single-stage queue threshold; and
    submitting the memory access operations to the memory die as non-cached operations if the number of entries in the single-stage queue does not exceed the single-stage queue threshold.

7. The method of claim 1,
    wherein the memory access queue is a two-stage queue that includes a first queue and a second queue, the second queue receiving entries only if the first queue is full; and
    wherein determining whether to submit the memory access operations to the memory die as cached operations or as non-cached operations includes comparing a number of entries in the second queue to a second queue threshold.

8. The method of claim 7, wherein submitting the memory access operations to the memory die comprises:
    submitting the memory access operations as cached operations if the number of entries in the second queue exceeds the second queue threshold; and
    submitting the memory access operations as non-cached operations if the number of entries in the second queue does not exceed the second queue threshold.

9. The method of claim 1, wherein the data storage controller includes a die manager, and the die manager assesses the fill status of the memory access queue and determines whether to submit the memory access operations to the memory die as cached operations or as non-cached operations.

10. The method of claim 9,
    wherein the memory device includes a plurality of memory dies with a separate memory access queue for each die, and
    wherein the die manager determines a number of entries in each separate memory access queue and separately determines, on a queue-by-queue basis, whether to submit memory access operations to a particular die as cached operations or as non-cached operations based on the number of entries in the memory access queue for the particular die.

11. A data storage controller for use with a memory device, comprising:
    a queue assessment component configured to determine a fill level of a memory access queue associated with the memory device, the memory device including a memory die with cache memory and non-cache memory;
    a memory access determination component configured to determine whether to submit memory access operations to the memory die as cached operations or as non-cached operations based on the fill level of the memory access queue; and a memory access controller configured to submit the memory access operations to the memory die as cached operations or as non-cached operations based on the determination made by the memory access determination component.

12. The data storage controller of claim 11, wherein the queue assessment component and the memory access determination component are components of a die manager, the die manager configured to determine the fill level of the memory access queue and submit the memory access operations to the memory die as cached operations or as non-cached operations based on the fill level of the memory access queue.

13. The data storage controller of claim 12,
wherein the memory device includes a plurality of memory dies with a separate memory access queue for each die, and
wherein the die manager is configured to determine a number of entries in each separate memory access queue and to separately determine, on a queue-by-queue basis, whether to submit memory access operations to a particular die as cached operations or as non-cached operations based on the number of entries in the memory access queue for the particular die.

14. The data storage controller of claim 11,
wherein the queue assessment component includes a queue entry counter configured to count a number of entries in the memory access queue to assess the fill level; and
wherein the memory access determination component includes a queue threshold comparator configured to determine whether to submit the memory access operations as cached operations or as non-cached operations by comparing the count to a queue threshold.

15. The data storage controller of claim 14, wherein the memory access queue is configured as a single-stage queue.

16. The data storage controller of claim 14, wherein the memory access queue is configured as a two-stage queue that includes a first queue and a second queue, the second queue configured to receive entries only if the first queue is full, and wherein the queue entry counter is configured to count the number of entries in the second stage of the two-stage queue.

17. The data storage controller of claim 11, wherein the memory access controller comprises a cached read submission controller and a non-cached read submission controller.

18. The data storage controller of claim 17,
wherein the cached read submission controller is configured to submit memory access operations as cached operations while the fill level exceeds a threshold; and
wherein the non-cached read submission controller is configured to submit the memory access operations as non-cached operations so long as the fill level does not exceed the threshold.

19. The data storage controller of claim 11, wherein the memory die is a non-volatile memory (NVM) die.

20. A data storage device, comprising:
a non-volatile memory (NVM) device having a die; and
a die manager configured to
determine a fill level of a memory access queue associated with the die, and
submit memory access operations to the die as cached operations or as non-cached operations based on the fill level of the memory access queue.

21. The data storage device of claim 20,
wherein the NVM device includes a plurality of dies with a separate memory access queue for each of the plurality of dies, and
wherein the die manager is configured to determine a fill level of each separate memory access queue and to separately determine, on a queue-by-queue basis, whether to submit memory access operations to a particular die as cached operations or as non-cached operations based on the fill level of the memory access queue for the particular die.

22. The data storage device of claim 20, wherein the NVM device is a NAND storage device.

23. An apparatus for use by a data storage controller, comprising:
means for determining a number of entries in a memory access queue associated with a memory device, the memory device including a memory die with cache memory and non-cache memory;
means for determining whether to submit memory access operations to the memory die as cached operations or as non-cached operations based on the number of entries in the memory access queue; and
means for submitting the memory access operations to the memory die as cached operations or as non-cached operations based on the determination made by the means for determining.

24. The apparatus of claim 23,
wherein the memory access queue is a single-stage queue; and
wherein the means for determining whether to submit the memory access operations to the memory device as cached operations or as non-cached operations includes means for comparing a number of entries in the single-stage queue to a single-stage queue threshold.

25. The apparatus of claim 24, wherein the means for submitting the memory access operations to the memory die includes:
means for submitting the memory access operations as cached operations if the number of entries in the single-stage queue exceeds the single-stage queue threshold; and
means for submitting the memory access operations as non-cached operations if the number of entries in the single-stage queue does not exceed the single-stage queue threshold.

26. The apparatus of claim 23,
wherein the memory access queue is a two-stage queue that includes a first queue and a second queue, the second queue receiving entries only if the first queue is full; and
wherein the means for determining whether to submit the memory access operations to the memory device as cached operations or as non-cached operations includes means for comparing a number of entries in the second queue to a second queue threshold.

27. The apparatus of claim 23, wherein the memory die is a non-volatile memory (NVM).

28. A method for use by a data storage controller, comprising:
assessing a fill status of a memory access queue associated with a memory device;
determining a memory access procedure for use in accessing the memory device based on the fill status of the memory access queue, including determining whether to submit memory access operations to the memory device as cached operations or as non-cached operations; and accessing the memory device based on the determined memory access procedure, wherein, if memory access operations are being submitted to the memory device as cached operations, automatically resuming non-cached submissions if the memory access queue becomes empty.

29. A data storage controller for use with a memory device, comprising:
- a queue assessment component configured to determine a fill level of a memory access queue associated with the memory device;
- a memory access determination component configured to determine a memory access procedure for use in accessing the memory device based on the fill level of the memory access queue; and
- a memory access controller configured to control access to the memory device based on the determined memory access procedure, wherein the memory access controller comprises a cached read submission controller and a non-cached read submission controller.

* * * * *